(12) United States Patent
Masui

(10) Patent No.: US 6,924,999 B2
(45) Date of Patent: Aug. 2, 2005

(54) FERROELECTRIC MEMORY

(75) Inventor: Shoichi Masui, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/819,192

(22) Filed: Apr. 7, 2004

(65) Prior Publication Data

US 2005/0057957 A1 Mar. 17, 2005

(30) Foreign Application Priority Data

Sep. 12, 2003 (JP) ................................. 2003-321501

(51) Int. Cl.[7] .............................................. G11C 11/22
(52) U.S. Cl. ................................... 365/145; 365/189.01
(58) Field of Search ............................ 365/145, 189.01

(56) References Cited

U.S. PATENT DOCUMENTS

| 5,146,299 A | * | 9/1992 | Lampe et al. ................ 257/295 |
| 5,381,379 A | * | 1/1995 | Fukumoto ................. 365/238.5 |
| 6,370,058 B1 | * | 4/2002 | Fukumoto .............. 365/185.08 |
| 6,867,447 B2 | * | 3/2005 | Summerfelt ................ 257/295 |

FOREIGN PATENT DOCUMENTS

| JP | 09-017965 | 1/1997 |
| JP | 2002-269969 | 9/2002 |
| JP | 2003-198361 | 7/2003 |
| JP | 2003-203475 | 7/2003 |

OTHER PUBLICATIONS

"A 512 Kbit low–voltage NV–SRAM with the size of a conventional SRAM," Tohru Miwa et al., 2001 Symposium on VLSI Circuits Digest of Technical Papers, pp. 129–132.

"A Ferroelectric Memory–Based Secure Dynamically Programmable Gate Array," Shoichi Masui et al., IEEE Journal of Solid–State Circuits, vol. 38, No. 5, May 2003, pp. 715–725.

"A Survey of Circuit Innovations in Ferroelectric Random–Access Memories," Ali Sheikholeslami et al., Proceedings of the IEEE, vol. 88, No. 5, May 2000, pp. 667–689.

* cited by examiner

Primary Examiner—Michael Tran
(74) Attorney, Agent, or Firm—Arent, Fox, PLLC.

(57) ABSTRACT

Memory cells each include a latch having storage nodes of data, and ferroelectric capacitors connected to the storage nodes at one ends, respectively, and to a plate line at the other ends. An operation control circuit performs volatile and nonvolatile write operations. A plate driver sets the plate line at a predetermined voltage so that a voltage exceeding a coercive voltage is applied between electrodes of the ferroelectric capacitor connected to either one end of the latch during the volatile write operation. Here, the latch retains the write data. It is therefore possible to dispense with a circuit generating a voltage lower than or equal to the coercive voltage and a circuit for switching voltages. This also eliminates the need for power supply line of the voltage lower than or equal to the coercive voltage, making the wiring area unnecessary. Consequently, the ferroelectric memory can be reduced in chip size.

18 Claims, 31 Drawing Sheets

Prior Art

| operation mode | power(VDDV) | BL, XBL | WL | PL (6T2C) | PL1,PL2 (6T4C) |
|---|---|---|---|---|---|
| standby | On | precharged | L | VDD/2 | VDD/2 |
| read | On | read data | H | VDD/2 | VDD/2 |
| write (program) | On | write data | H | H→L | H→L |
| recall | Off→On | precharged | L | L→H | PL1:L→H PL2:L |
| power-off | On→Off | precharged | L | VDD/2→L | VDD/2→L |

⇩ write reverse data (program)

(2)

⇩ write reverse data again (program)

(3)

| operation mode | power(VDDV) | BL, XBL | WL | PL |
|---|---|---|---|---|
| standby | On | precharged | L | L |
| read | On | read data | H | L |
| volatile write (write) | On | write data | H | L |
| nonvolatile write (store) | On | precharged | L | L→H |
| recall | Off→On | precharged | L | L→H |
| power-off | On→Off | precharged | L | L |

Fig. 10

(1) after recall operation in power-on sequence

⇩ volatile-write reverse data (2)

⇩ volatile-write reverse data again (3)

⇩ nonvolatile-write (store)

(4)

| operation mode | power(VDDV) | BL, XBL | WL | PL |
|---|---|---|---|---|
| standby | On | precharged | L | H |
| read | On | read data | H | H |
| volatile write (write) | On | write data | H | H |
| nonvolatile write (store) | On→Off | precharged | L | H→L |
| recall | Off→On | precharged | L | L→H→L |
| power-off | On→Off | precharged | L | H→L |

Fig. 14

(1) after recall operation in power-on sequence

⇩ volatile-write reverse data (2)

⇩ volatile-write reverse data again (3)

⇩ nonvolatile-write (store)

(4)

| operation mode | power(VDDV) (block) | BL, XBL | WL | PL |
|---|---|---|---|---|
| standby | On | precharged | L | L |
| read | On | read data | H | L |
| volatile write (write) | On | write data | H | L |
| nonvolatile write (block store) | On | precharged | L | L→H |
| recall (block recall) | Off→On | precharged | L | L→H |
| power-off (block) | On→Off | precharged | L | L |

Fig. 20

| operation mode | power(VDDV) | BL, XBL | WL | PL1 | PL2 |
|---|---|---|---|---|---|
| standby | On | precharged | L | L | L |
| read | On | read data | H | L | L |
| volatile write (write) | On | write data | H | L | L |
| nonvolatile write (store) | On | precharged | L | L→H | L→H |
| recall | Off→On | precharged | L | L→H | L |
| power-off | On→Off | precharged | L | L | L |

Fig. 23

(1) after recall operation in power-on sequence

⇩ volatile-write reverse data (2)

⇩ volatile-write reverse data again (3)

⇩ nonvolatile-write (store)

(4)

| operation mode | power(VDDV) | BL, XBL | WL | PL1 | PL2 |
|---|---|---|---|---|---|
| standby | On | precharged | L | H | H |
| read | On | read data | H | H | H |
| volatile write (write) | On | write data | H | H | H |
| nonvolatile write (store) | On | precharged | L | H→L | H→L |
| recall | Off→On | precharged | L | L→H→L | L |
| power-off | On→Off | precharged | L | H | H |

Fig. 27

(1) after recall operation in power-on sequence

⇩ volatile-write reverse data (2)

⇩ volatile-write reverse data again (3)

⇩ nonvolatile-write (store)

(4)

| operation mode | power(VDDV) (block) | BL, XBL | WL | PL1 | PL2 |
|---|---|---|---|---|---|
| standby | On | precharged | L | L | L |
| read | On | read data | H | L | L |
| volatile write (write) | On | write data | H | L | L |
| nonvolatile write (block store) | On | precharged | L | L→H | L→H |
| recall (block recall) | On | precharged | L | L→H | L |
| power-off (block) | On→Off | precharged | L | L | L |

Fig. 33

FERROELECTRIC MEMORY

CROSS-REFERENCE TO RELATED APPLICATIONS

This application is based upon and claims the benefit of priority from the prior Japanese Patent Application No. 2003-321501, filed on Sep. 12, 2003, the entire contents of which are incorporated herein by reference.

BACKGROUND OF THE INVENTION

1. Field of the Invention

The present invention relates to a ferroelectric memory having ferroelectric capacitors.

2. Description of the Related Art

Ferroelectric memories can retain data without a power supply, by operating their ferroelectric capacitors made of ferroelectric material, which is insulated material, as variable capacitors and utilizing remanent dielectric polarization remaining even after the voltages applied to the ferroelectric capacitors are removed. This nonvolatility is utilized to achieve a nonvolatile memory with ferroelectric memory cells (for example, FIGS. 1–4 to be described later) arranged in an array. For the ferroelectric capacitors, ferroelectric materials chiefly composed of PZT (lead zirconate titanate) or ferroelectric materials having a bismuth layer type perovskite structure such as SBT (strontium bismuth tantalate) are available.

FIG. 1 shows an overview of a ferroelectric memory which is composed of memory cells MC called 1T1C. A 1T1C memory cell consists of a single transfer transistor TR and a single ferroelectric capacitor FC for retaining a single bit of information. One end of the ferroelectric capacitor FC is connected to a bit line BLE or BLO through the transfer transistor TR. The other end of the ferroelectric capacitor FC is connected to a plate line PL. The gate of the transfer transistor TR is connected to a word line WLE or WLO.

A reference memory cell RMC connected with the bit line pair BLE, BLO has a reference capacitor FCR, which is made of a ferroelectric capacitor, and two nMOS transistors M1 and M2. The reference capacitor FCR has, for example, a capacitance intermediate between the capacitance of a ferroelectric capacitor FC containing "logic 0" and that of a ferroelectric capacitor containing "logic 1". The nMOS transistor M1 connects the reference capacitor FCR to the bit line BLE when a reference word line RWLO is at H level. The nMOS transistor M2 connects the reference capacitor FCR to the bit line BLO when a reference word line RWLE is at H level.

FIG. 2 shows an overview of a ferroelectric memory which is composed of memory cells MC called 2T2C. A 2T2C memory cell has two transfer transistors TR1, TR2 and two ferroelectric capacitors FC1, FC2 for retaining a single bit of information. One ends of the ferroelectric capacitors FC1 and FC2 are connected to complementary bit lines BL and XBL through the transfer transistors TR1 and TR2, respectively. The other ends of the ferroelectric capacitors FC are connected to a plate line PL. The gates of the transfer transistors TR1 and TR2 are connected to a common word line WL.

Since 1T1C memory cells allow a reduction in cell size, they are adopted in ferroelectric memories for high density applications. Since 2T2C memory cells store complementary data in their two ferroelectric capacitors, they allow greater read margins. Thus, 2T2C memory cells are adopted in ferroelectric memories for high reliability applications. As above, 1T1C memory cells and 2T2C memory cells have respective segmented markets (A. Sheikholeslami and G. Gulak, "A Survey of Circuit Innovations in Ferroelectric Random-Access Memories", Proceedings of IEEE, vol. 88, no. 5, pp. 667–689, 2000).

The inventors have also proposed a nonvolatile SRAM using new memory cells (6T2C or 6T4C) which are constituted by adding two or four ferroelectric capacitors to SRAM memory cells each consisting of six transistors (Japanese Unexamined Patent Application Publication No. 2003-203475). They have also released examples of application of these memory cells to programmable logic devices Japanese Unexamined Patent Application Publication No. 2003-198361, S. Masui et al., "Ferroelectric Memory-Based Secure Dynamically Programmable Gate Array", IEEE Journal of Solid-State Circuits, vol. 38, no. 5, pp. 715–725, 2003).

FIG. 3 shows a 6T2C memory cell. This memory cell MC comprises: a latch LT which is composed of two CMOS inverters having their inputs and outputs connected to each other; ferroelectric capacitors FC1 and FC2 which are connected to two input/output nodes (storage nodes) S1 and S2 of the latch LT, respectively; and transfer transistors TR1 and TR2 for connecting the input/output nodes S1 and S2 to complementary bit lines BL and XBL, respectively. The sources of the pMOS transistors M1 and M3 of the CMOS inverters are connected to a power supply line VDD. The sources of the nMOS transistors M2 and M4 of the CMOS inverters are connected to the other side of power supply line VSS, connected to a ground. The gates of the transfer transistors TR1 and TR2 are connected to a common word line WL.

FIG. 4 shows a 6T4C memory cell. This memory cell MC is constituted by adding ferroelectric capacitors FC3 and FC4 to the memory cell MC of 6T2C type shown in FIG. 3. The ferroelectric capacitor FC3 is connected to the input/output node S1 at one end, and is connected to a plate line PL2 at the other end. The ferroelectric capacitor FC4 is connected to the input/output node S2 at one end, and is connected to the plate line PL2 at the other end. The other ends of the ferroelectric capacitors FC1 and FC2 are connected to a plate line PL1.

FIG. 5 shows operation modes of a nonvolatile SRAM having 6T2C memory cells or 6T4C memory cells (S. Masui et al., "Ferroelectric Memory-Based Secure Dynamically Programmable Gate Array", IEEE Journal of Solid-State Circuits, vol. 38, no. 5, pp. 715–725, 2003, T. Miwa et al., "A 512-kbit Low-Voltage NV-SRAM with the size of conventional SRAM", 2001 VLSI Circuit Symposium, pp. 129–132). During standby, the bit lines BL and XBL are precharged, the word lines WL are deselected (L level), and the plate lines PL (or PL1, PL2) are kept at VDD/2. In a read operation, a word line WL is selected (H level) from the standby state, and data retained in the latches LT is read to the complementary bit lines BL and XBL as read data. Since the plate lines PL, PL1, PL2 are kept at VDD/2 during standby and in a read operation, it is possible to maintain the voltage applied between the electrodes of the ferroelectric capacitors low and avoid material deterioration (imprint) of the ferroelectric capacitors.

The 6T2C type and 6T4C type nonvolatile SRAMs make the same read operation as the read operation of an SRAM having memory cells each consisting of six transistors, or in other words, read operation is done without driving the plate lines. As compared to ferroelectric memories of 1T1C type and 2T2C type in which the plate lines are driven in each read operation, data stored in 6T2C or 6T4C cell can thus be read over 10 times faster than the cases for 1T1C and 2T2C. In addition, a restriction on the possible number of reads, which has been a problem of 1T1C type cells and 2T2C type cells, is eliminated.

In a write operation, complementary write data is supplied to latches LT via the bit lines BL and XBL before the plate lines PL (or PL1, PL2) are driven from VDD/2 to H level (=VDD) and to L level (=VSS) successively, thereby programming the ferroelectric capacitors with the write data.

In a recall operation, the plate lines PL (or PL1) are driven from L level to H level while all WLs are deselected. Subsequently, the power supply VDD and VSS are supplied to the latches LT so that the logic values corresponding to the voltages occurring on the input/output nodes S1 and S2 are latched, and the data retained in the ferroelectric capacitors is read to the latches LT. In a power-off operation, the bit lines BL and XBL are precharged, the word lines WL are deselected, and the plate lines PL (or PL1, PL2) fall from VDD/2 to L level before the supply of the power supply VDD and VSS to the ferroelectric memory is stopped.

FIG. 6 shows a write operation of a conventional ferroelectric memory. In writing reverse data to a memory cell, the dielectric polarization values P of the ferroelectric capacitors connected to the nodes S1 and S2 reverse in polarity upon each write as shown by the black circles S1 and S2 on the hysteresis loops shown to the right in the diagram (reverse polarization). Here, the polarities of the black circles S1 and S2 are shown with reference to the voltage of the plate line PL.

FIG. 7 shows a hysteresis loop of the ferroelectric material to form the ferroelectric capacitors of a ferroelectric memory that operates under a power supply voltage of 3.3 V. The ferroelectric capacitors reverse in polarization when their state changes from "1" data which indicates the application of a positive voltage with reference to the plate line to "0" data which indicates the application of a negative voltage. The ferroelectric capacitors cause reverse polarization when a voltage higher than or equal to a coercive voltage Vc (or lower than or equal to −Vc) is applied between their electrodes. The coercive voltages Vc and −Vc are shown by the intersections between the hysteresis loop and the voltage axis (abscissa). In this example, ferroelectric capacitors containing "0" data cause reverse polarization when a voltage higher than or equal to +0.8 V is applied thereto. Ferroelectric capacitors containing "1" data cause reverse polarization when a voltage lower than or equal to −0.8 V is applied thereto. Due to reverse polarization, the data stored in the ferroelectric capacitors disappears. When reverse polarization is repeated, the ferroelectric material deteriorates and the residual dielectric polarization decreases/disappears. This makes it impossible to perform nonvolatile operations.

As described above, in the nonvolatile SRAMs having conventional 6T2C memory cells and 6T4C memory cells, the ferroelectric capacitors cause reverse polarization in writing reverse data to the memory cells MC. Consequently, the maximum number of rewrites to a memory cell MC is limited to $1 \times 10^{13}$ times due to the deterioration characteristics of the ferroelectric material. Consequently, although they are capable of operation at 100 MHz or above, the nonvolatile SRAMs having 6T2C memory cells and 6T4C memory cells are unavailable to such applications that a CPU or other arithmetic circuit performs frequent write operations, and thus have only a limited market.

In order to remove the restriction on the number of rewrites, there have been proposed technologies for performing the write operations of a ferroelectric memory having 6T2C memory cells in the form of a normal write operation (volatile write operation) without reversing polarization of the ferroelectric capacitors and a store operation (nonvolatile write operation) causing reverse polarization of the ferroelectric capacitors to write data into the ferroelectric capacitors Japanese Unexamined Patent Application Publication No. Hei 9-17965, Japanese Unexamined Patent Application Publication No. 2002-229969). With no reverse polarization, dielectric polarization values move on the hysteresis loop without causing deterioration of the ferroelectric material. Thus, volatile write operations without reverse polarization have no restriction in the number of rewrites. Nevertheless, for example, in Japanese Unexamined Patent Application Publication 2002-229969, the voltage of the plate lines is kept at VDD/2 when volatile writes are performed. Since coercive voltages are typically lower than VDD/2, the conventional volatile writes have the problem that reverse polarization can occur.

In conventional ferroelectric memories capable of volatile write operations, voltages lower than or equal to the coercive voltages must be applied to the ferroelectric capacitors so as to prevent the ferroelectric capacitors from causing reverse polarization during the volatile write operations. This requires a circuit for switching the power supply lines of the latches among three types of voltages as shown in Japanese Unexamined Patent Application Publication No. Hei 9-17965. As a result, there have been the problems of complicated voltage switching control and greater circuit scale. Moreover, since a plurality of power lines must be laid, there have also been the problems of greater wiring area and smaller operating speed.

SUMMARY OF THE INVENTION

It is an object of the present invention to reduce the circuit scale of a ferroelectric memory capable of performing a volatile write operation and a nonvolatile write operation (store operation), and the wiring area of power supply thereof for a reduction in chip size.

According to one of the aspects of the ferroelectric memory of the present invention, a plurality of memory cells each include a latch having storage nodes through which complementary data is input/output, respectively, and ferroelectric capacitors connected to the storage nodes at one ends, respectively, and connected to a plate line at the other ends. An operation control circuit performs a volatile write operation for writing write data into the latch and a nonvolatile write operation (store operation) for writing the write data retained in the latch into the ferroelectric capacitors. That is, the ferroelectric memory has the function of performing two types of write operations. A plate driver sets the plate line to a predetermined voltage so that a voltage exceeding a coercive voltage is applied between electrodes of one of the ferroelectric capacitors connected to either one of the storage nodes of the latch during the volatile write operation.

For example, a volatile write operation is performed when writing data from the exterior of the ferroelectric memory. A nonvolatile write operation is performed when turning off the power supply of the ferroelectric memory. During volatile write operations, even if the voltage exceeding the coercive voltage is applied between the electrodes of the ferroelectric capacitors, dielectric polarization of the ferroelectric capacitors will not change except when data reverse to that stored in the memory cell is written for the first time after a recall operation or a nonvolatile write operation. Specifically, the ferroelectric capacitors respectively connected to the storage nodes of the latch exhibit, in principle, dielectric polarization in the same direction. Consequently, polarization information corresponding to the data stored in the ferroelectric capacitors disappears. This does not mean loss of the data written to the memory cell, however, since the write data is retained in the latch. In volatile write operations, the entire memory cell can thus retain data even when the voltage exceeding the coercive voltage is applied between the electrodes of the ferroelectric capacitors. In other words, there is no need to generate a special voltage (a voltage lower than or equal to the coercive voltage, or a voltage higher than the power supply voltage when the power supply voltage is lower than or equal to the coercive voltage) for precluding reverse polarization in volatile write operations. It is therefore possible to dispense with a circuit for generating this special voltage and a circuit for switching voltages, allowing a reduction in circuit scale of the ferroelectric memory. This also eliminates the need for power supply lines for supplying the special voltage, making the wiring area unnecessary. As a result, the ferroelectric memory can be reduced in chip size (or core size).

According to another aspect of the ferroelectric memory of the present invention, the plate driver drives the plate line under the control of the operation control circuit. The latch receives a ground voltage and a fixed power supply voltage, and outputs the power supply voltage or the ground voltage to the storage nodes according to a logic of the retained write data. The plate driver maintains the voltage of the plate line at a voltage either one of lower than or equal to the ground voltage and higher than or equal to the power supply voltage during the volatile write operation. That is, during the volatile write operation, the voltage of the plate line is set at a voltage either one of higher than or equal to the H-level voltage of the storage nodes and lower than or equal to the L-level voltage.

During the volatile write operation, positive voltages or negative voltages keep being applied between the electrodes of the ferroelectric capacitors connected to the pair of storage nodes, respectively, regardless of the logic of the write data. Thus, in the second and subsequent volatile write operations, any reverse polarization of the ferroelectric capacitors will not occur. As a result, it is possible to remove the restriction on the number of volatile writes even though the voltage exceeding the coercive voltage is applied between the electrodes of one of the ferroelectric capacitors during volatile write operations. Since a nonvolatile write operation has only to be performed each time the power supply of the ferroelectric memory is turned off, it is low in the frequency of execution. Consequently, the restriction on the number of writes including both volatile writes and nonvolatile writes can be substantially removed with no increase in chip size.

According to another aspect of the ferroelectric memory of the present invention, the plate driver maintains the voltage of the plate line at the ground voltage (the L-level voltage of the storage nodes) or the power supply voltage (the H-level voltage of the storage nodes) during the volatile write operation. Since the voltage of the plate line during the volatile write operation is set at the same value as the power supply voltage or the ground voltage to be supplied to the latch of the memory cell, the plate driver and other circuits can be configured simply for simple control.

According to another aspect of the ferroelectric memory of the present invention, the plate driver maintains the voltage of the plate line at a first voltage during the volatile write operation, and changes the voltage of the plate line from the first voltage to a second voltage during the nonvolatile write operation. Since the plate line is set at the fixed voltage during the volatile write operation, it is possible to prevent reverse polarization of the ferroelectric capacitors in the second and subsequent volatile write operations, even when a voltage exceeding the coercive voltage is applied between the electrodes of one of the ferroelectric capacitors. This can eliminate the restriction on the number of volatile writes. In nonvolatile write operations, on the other hand, the voltage of the plate line can be changed to cause reverse polarization of the ferroelectric capacitors. The data retained in the latch can thus be written in a nonvolatile manner to the ferroelectric capacitors with high reliability.

According to another aspect of the ferroelectric memory of the present invention, the latch receives a ground voltage and a fixed power supply voltage, and outputs the power supply voltage or the ground voltage to the storage nodes according to a logic of the retained write data. The first voltage to be supplied to the plate line in the nonvolatile write operation is the ground voltage. The second voltage is higher than the power supply voltage for the latch to output to the storage nodes.

In the nonvolatile write operation, the second voltage to be supplied to the plate line is set higher than the power supply voltage for the latch to output to the storage nodes. This can enlarge the hysteresis loop which shows the characteristics of dielectric polarization of the ferroelectric capacitors. That is, the data retained in the latch can be written in a nonvolatile manner to the ferroelectric capacitors with higher reliability. In situations other than during the nonvolatile write operation (such as during standby), the voltages applied between the electrodes of one of the ferroelectric capacitors can be made relatively smaller to reduce an imprint effect. As a result, it is possible to avoid a decrease in operating margin.

According to another aspect of the ferroelectric memory of the present invention, the second voltage is an I/O power supply voltage to be supplied through an I/O power terminal to a data input/output circuit which inputs/outputs data from/to a data terminal. The second voltage can thus be generated easily by using the I/O power supply voltage. This eliminates the need for a voltage boost circuit or the like for generating the second voltage. It is therefore possible to avoid an increase in circuit scale and preclude an increase in power consumption ascribable to the voltage boost circuit.

According to another aspect of the ferroelectric memory of the present invention, a power supply control circuit steps down an external power supply voltage received at a power supply terminal to the power supply voltage. The first voltage is the ground voltage, and the second voltage is the external power supply voltage. Since the external power supply voltage supplied from the exterior of the ferroelectric memory is used as the second voltage, the second voltage higher than the power supply voltage can be generated easily.

According to another aspect of the ferroelectric memory of the present invention, the volatile write operation and the nonvolatile write operation are performed in response to commands supplied from the exterior of the ferroelectric memory. A system that accesses the ferroelectric memory can thus perform volatile writes and nonvolatile writes with complete control. As a result, the frequency of nonvolatile write operations can be minimized to be adapted to the system, allowing an improvement of the system performance.

According to another aspect of the ferroelectric memory of the present invention, a recall operation can be performed automatically when the ferroelectric memory is powered on. It is therefore possible to reduce the load on the system that accesses the ferroelectric memory and improve the system performance.

According to another aspect of the ferroelectric memory of the present invention, a plurality of data terminals receives a plurality of bits of write data by each bit. The volatile write operation is performed in units of a single bit for each of the data terminals. The nonvolatile write operation is performed on all the memory cells. For example, the data of all the memory cells is written in a nonvolatile manner to the ferroelectric capacitors by performing only a single nonvolatile write operation before turning off the power supply of the ferroelectric memory. It is therefore possible to simplify the power-off control of the system that accesses the ferroelectric memory, improve the system efficiency, and reduce the system cost.

According to another aspect of the ferroelectric memory of the present invention, a plurality of data terminals receives a plurality of bits of write data by each bit. A plurality of memory blocks each includes a predetermined number of the memory cells. The volatile write operation is performed in units of a single bit for each of the data terminals. The nonvolatile write operation is performed on all memory cells with respect to each of the memory blocks. Since the nonvolatile write operation is performed for each memory block, it is possible to turn off the power supply of the memory block(s) not in access while the power supply of the memory block(s) in access is on. As a result, the ferroelectric memory can be reduced in power consumption during standby.

According to another aspect of the ferroelectric memory of the present invention, a power-off command is received from the exterior of the ferroelectric memory. This makes it possible to stop supplying the power supply voltage with respect to each memory block.

According to another aspect of the ferroelectric memory of the present invention, an address signal is received along with the power-off command. This facilitates powering off a desired memory block.

According to another aspect of the ferroelectric memory of the present invention, a recall command can be received to perform a recall operation on a selected memory block alone.

According to another aspect of the ferroelectric memory of the present invention, an address signal is received along with the recall command. This facilitates performing a recall operation on a desired memory block.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory diagram showing the operation modes of a conventional nonvolatile SRAM having 6T2C memory cells or 6T4C memory cells;

FIG. 10 is an explanatory diagram showing the operation modes of the ferroelectric memory according to the first embodiment;

FIG. 14 is an explanatory diagram showing the operation modes of the ferroelectric memory according to the second embodiment;

FIG. 20 is an explanatory diagram showing the operation modes of the ferroelectric memory according to the fifth embodiment;

FIG. 23 is an explanatory diagram showing the operation modes of the ferroelectric memory according to the sixth embodiment;

FIG. 27 is an explanatory diagram showing the operation modes of the ferroelectric memory according to the seventh embodiment;

FIG. 33 is an explanatory diagram showing the operation modes of the ferroelectric memory according to the tenth embodiment.

DESCRIPTION OF THE PREFERRED EMBODIMENTS

Figure 1:
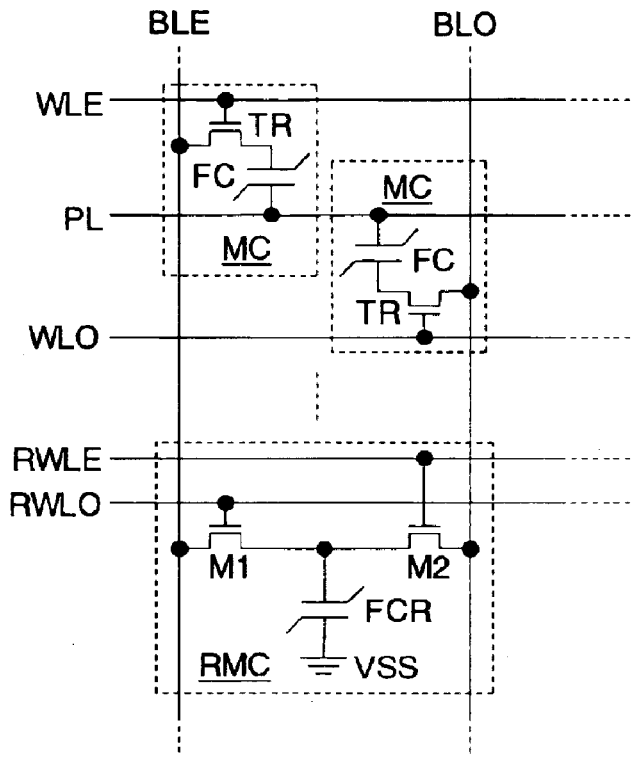
FIG. 1 is a circuit diagram showing an overview of a conventional ferroelectric memory which is composed of 1T1C memory cells.
Figure 2:
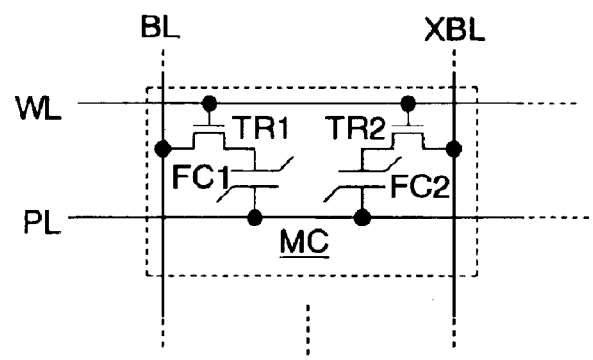
FIG. 2 is a circuit diagram showing an overview of a conventional ferroelectric memory which is composed of 2T2C memory cells.

Hereinafter, embodiments of the present invention will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting signals are designated by the same reference symbols as the names of the signals.

Figure 8:
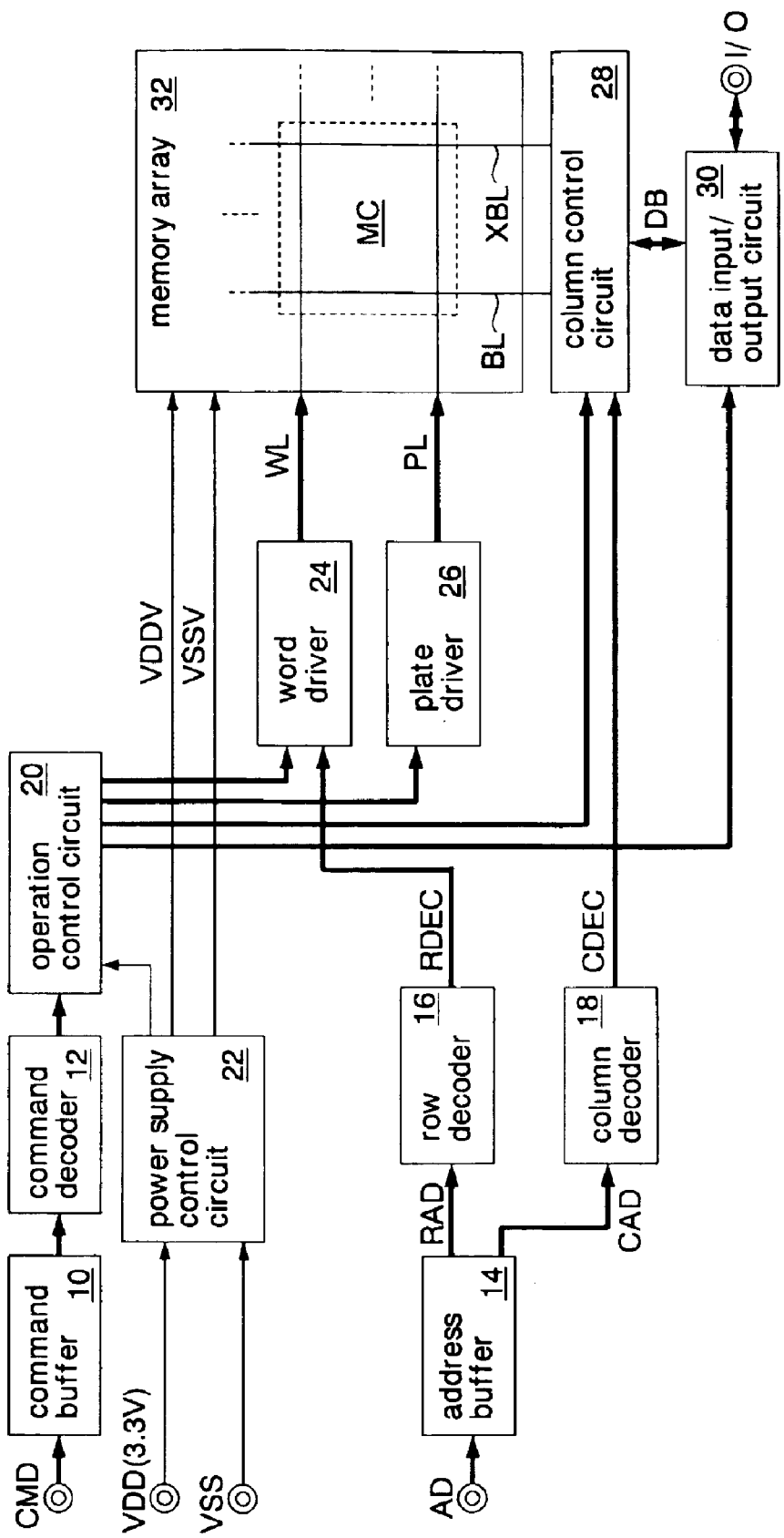
FIG. 8 is a block diagram showing a first embodiment of the ferroelectric memory according to the present invention.

FIG. 8 shows a first embodiment of the ferroelectric memory of the present invention. The ferroelectric memory is formed as a nonvolatile SRAM on a silicon substrate by using conventional CMOS process and additional ferroelectric capacitor formation process. The nonvolatile SRAM is incorporated, for example, as a memory core in a system LSI to be mounted on a cellular phone. The nonvolatile SRAM can be adopted to replace a plurality of types of memories conventionally used in a cellular phone (for example, a flash memory and a DRAM) with the single type.

The nonvolatile SRAM has a command buffer 10, a command decoder 12, an address buffer 14, a row decoder 16, a column decoder 18, an operation control circuit 20, a power supply control circuit 22, a word driver 24, a plate driver 26, a column control circuit 28, a data input/output circuit 30, and a memory array 32.

The command buffer 10 receives command signals CMD including a chip select signal, an output enable signal, a write enable signal, a write mode signal, and a power-off signal through a command terminal CMD, and outputs the same to the command decoder 12. The command decoder 12 decodes the command signals CMD, and outputs the decoding results to the operation control circuit 20. The types of commands include a read command, a volatile write command, a nonvolatile write command (store command), and a standby command which indicates that none of those commands is input. The command buffer 10 and the command data 12 operate as a command control circuit.

For example, when the chip enable signal is active and the write enable signal is inactive, the read command is recognized. When the chip enable signal and the write enable signal are active, the volatile write command or nonvolatile write command is recognized depending on the level of the write mode signal. When the chip enable signal, the write enable signal, and the output enable signal are inactive, the standby command is recognized.

The nonvolatile SRAM thus performs a volatile write operation and a nonvolatile write operation (store operation) according to the volatile write command and the nonvolatile write command from exterior. Consequently, a system that accesses the nonvolatile SRAM can effect execution with complete control according to the system conditions. As a result, the frequency of nonvolatile write operations can be minimized to the system, allowing an improvement of the system performance.

The address buffer 14 receives an address signal AD through an address terminal AD, and outputs the high-order bits and low-order bits of the received address signal AD as a row address signal RAD and a column address signal CAD, respectively. The row decoder 16 decodes the row address signal RAD to generate a decoding signal RDEC, and outputs it to the word driver 24. The column decoder 18 decodes the column address signal CAD to generate a decoding signal CDEC, and outputs it to the column control circuit 28.

In accordance with the output of the command decoder 12 and the output of the power supply control circuit 22, the operation control circuit 20 generates control signals for controlling the operations of the word driver 24, the plate driver 26, the column control circuit 28, and the data input/output circuit 30 in order to perform a read operation, a volatile write operation, a nonvolatile write operation (store operation), a recall operation, and a power-off operation on the memory array 32. A period in which none of the read operation, the volatile write operation, the nonvolatile write operation, and the recall operation is performed is a standby period. The operation control circuit 20 maintains the control signals at predetermined levels during the standby period.

The power supply control circuit 22 receives a power supply voltage VDD and a ground voltage VSS which are supplied to power supply terminals VDD and VSS. In a power-on period where the supply of the power supply voltage VDD to the nonvolatile SRAM is started, the power supply control circuit 22 outputs a recall command to the operation control circuit 20 to perform a recall operation on the memory array 32 when the power supply voltage VDD reaches a predetermined value capable of operating the nonvolatile SRAM. The power supply control circuit 22 also outputs a power-off command when it detects a drop in the power supply voltage VDD. In other words, the recall operation and the power-off operation can be performed as the power-on and power-off sequences of the nonvolatile SRAM automatically without receiving a command from exterior of the nonvolatile SRAM. It is therefore possible to reduce the load on the system that accesses the nonvolatile SRAM, with an improvement of the system performance.

The power supply voltage VDD supplied to the power supply terminal VDD is 3.3 V, for example. The power supply control circuit 22 supplies the power supply voltage VDDV and the virtual ground voltage VSSV to the memory array 32 after plate lines PL are driven by the operation control circuit 20 for a recall operation. Subsequently, the power supply control circuit 22 keeps supplying the fixed power supply voltage VDDV and the ground voltage VSSV to the memory array 32 while the power supply terminal VDD is supplied with the power supply voltage.

During a read operation and during a volatile write operation, the word driver 24 selects a word line WL corresponding to the decoding signal RDEC in response to the control signal from the operation control circuit 20. The selected word line WL is set at the power supply voltage VDD. Nonselected word lines WL are set at the ground voltage VSS. The word driver 24 maintains all the word lines WL at L level (VSS) in a standby period, during a nonvolatile write operation, during a recall operation, and during a power-off operation.

During a nonvolatile write operation and during a recall operation, the plate driver 26 changes all the plate lines PL from L level (VSS) to H level (VDD) for a predetermined period in response to the control signal from the operation control circuit 20. The plate driver 26 maintains all the plate lines PL at L level (VSS) in a standby period, during a read operation, during a volatile write operation, and during a power-off operation.

The column control circuit 28 has a plurality of sense amplifiers, a plurality of write amplifiers, and a plurality of column switches connected to bit lines BL and XBL. In a read operation, the sense amplifiers amplify voltage differences between the bit lines BL and XBL which occur according to the residual dielectric polarization values of ferroelectric capacitors. In a volatile write operation, the write amplifiers supply the bit lines BL (or XBL) with the power supply voltage VDD or the ground voltage VSS in accordance with write data supplied from exterior. The column switches turn on according to the decoding signal CDEC, thereby connecting predetermined bit lines BL and XBL to data bus lines DB.

The data input/output circuit 30 outputs write data from exterior to the column control circuit 28 or outputs read data from the column control circuit 28 to data terminals I/O depending on the control signal from the operation control circuit 20. The number of data terminals I/O is 16 bits, for example.

Figure 3:
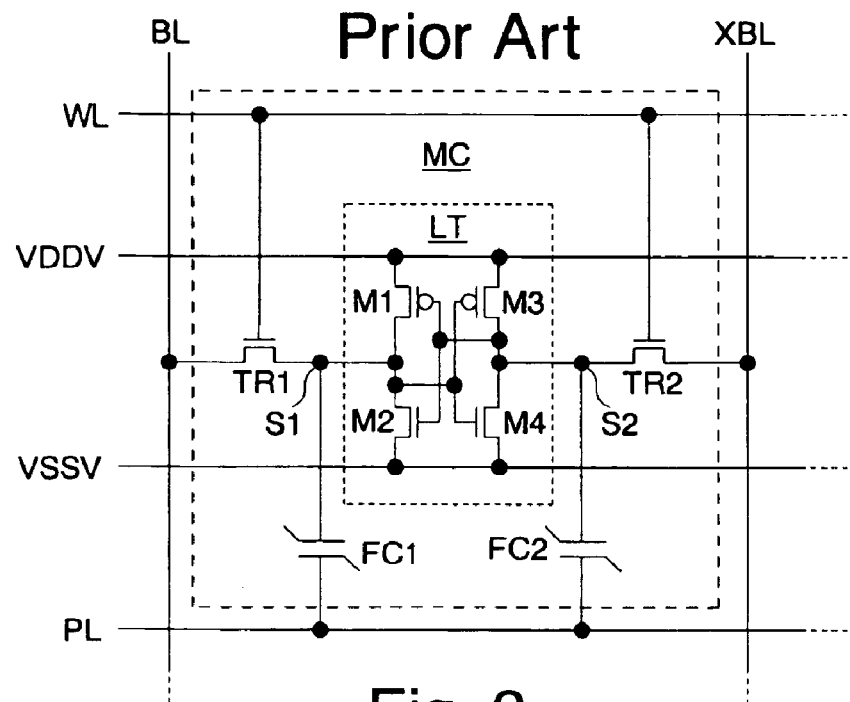
FIG. 3 is a circuit diagram showing a 6T2C memory cell.
Figure 4:
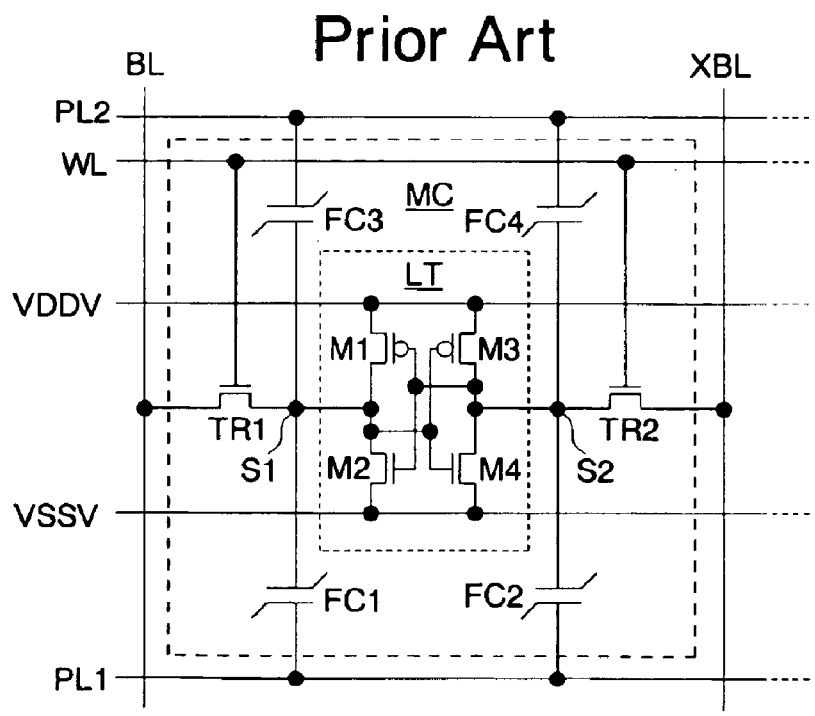
FIG. 4 is a circuit diagram showing a 6T4C memory cell.
Figure 6:
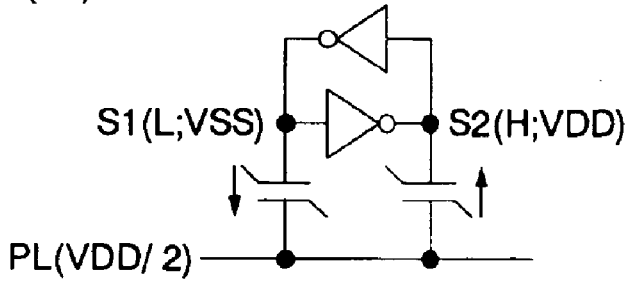
FIG. 6 is an explanatory diagram showing write operations in a conventional ferroelectric memory.
Figure 6:
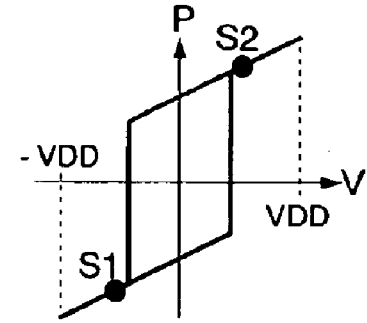
Figure 6:
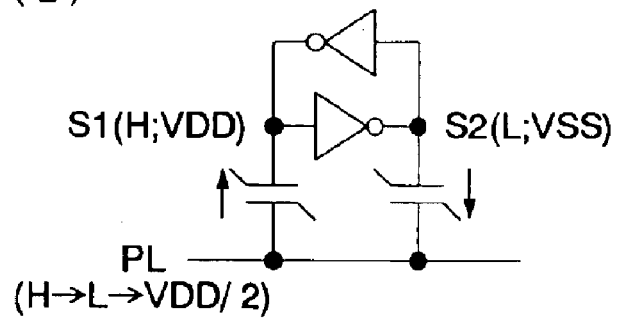
Figure 6:
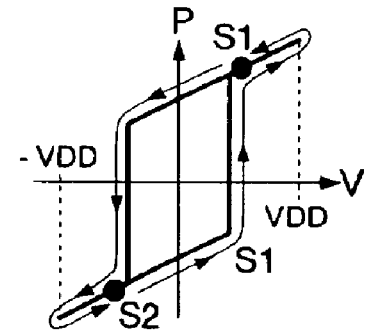
Figure 6:
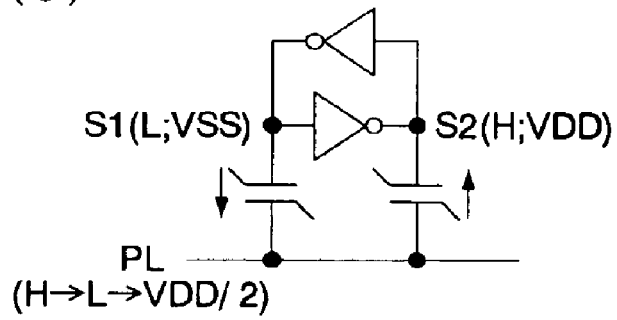
Figure 6:
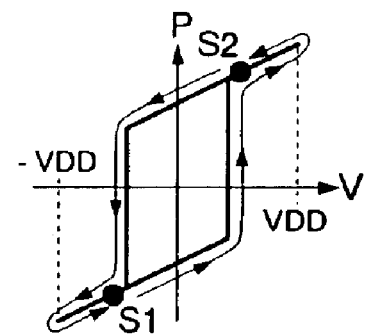

The memory array 32 has a plurality of memory cells MC arranged in an array, and a plurality of word lines WL, a plurality of plate lines PL, and a plurality of bit line pairs BL and XBL which are connected to the memory cells MC. The memory cells MC are 6T2C type memory cells shown in FIG. 3 described above.

Figure 9:
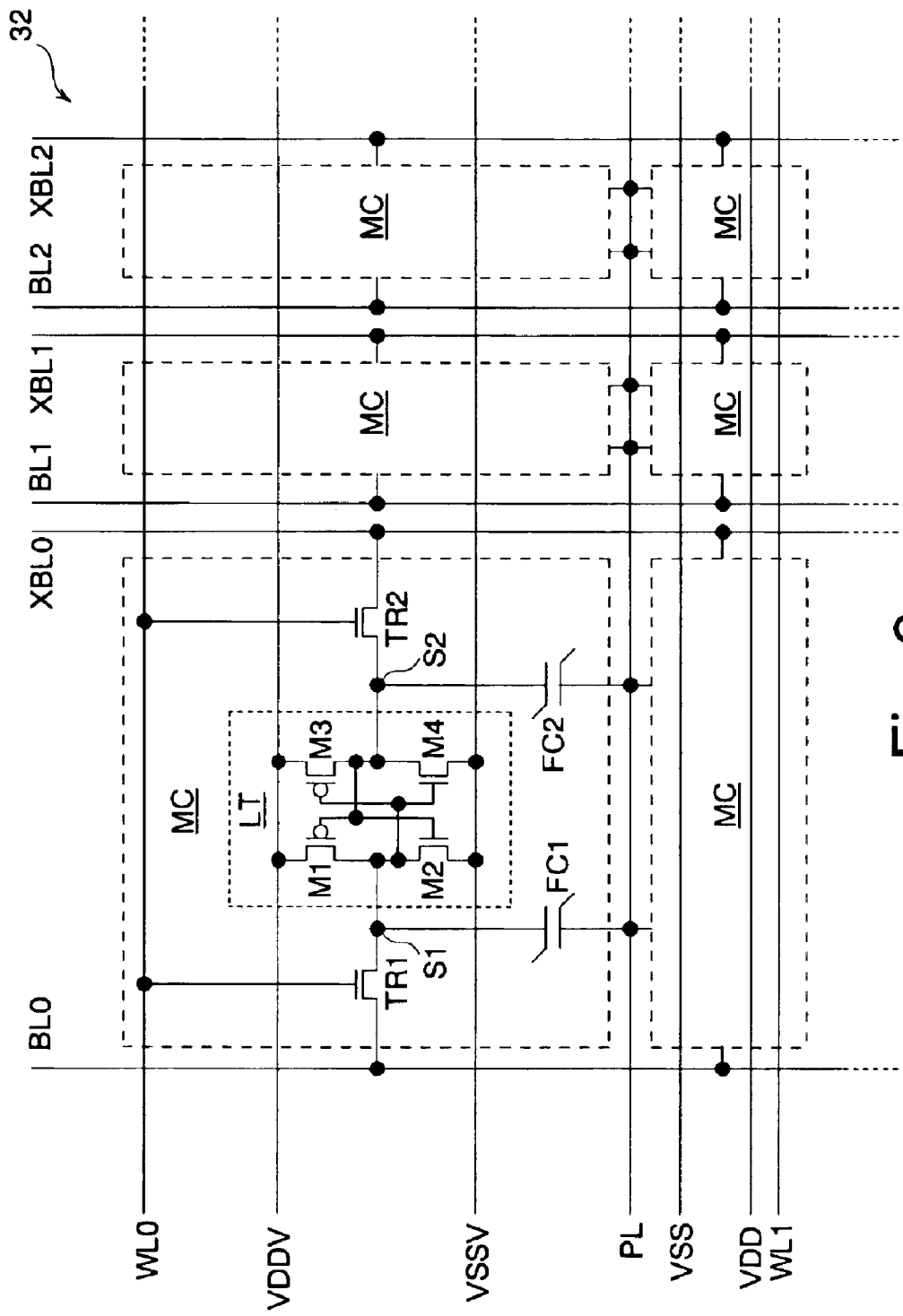
FIG. 9 is a circuit diagram showing the details of the memory array shown in FIG. 8.

FIG. 9 shows the details of the memory array 32 shown in FIG. 8. The word lines WL (WL0, WL1, . . . ) are connected commonly to memory cells MC aligned horizontally in the diagram. The plate lines PL are connected commonly to all the memory cells MC. The complementary bit line pairs BL and XBL (BL0, XBL0, BL1, XBL1, . . . ) are connected commonly to memory cells MC vertically aligned in the diagram. In each memory cell MC, the sources of the pMOS transistors M1 and M3 constituting a latch LT are connected to a power supply line VDDV (an output of the power supply control circuit 22). The sources of the nMOS transistors M2 and M4 are connected to a virtual ground line VSSV (an output of the power supply control circuit 22).

Figure 7:
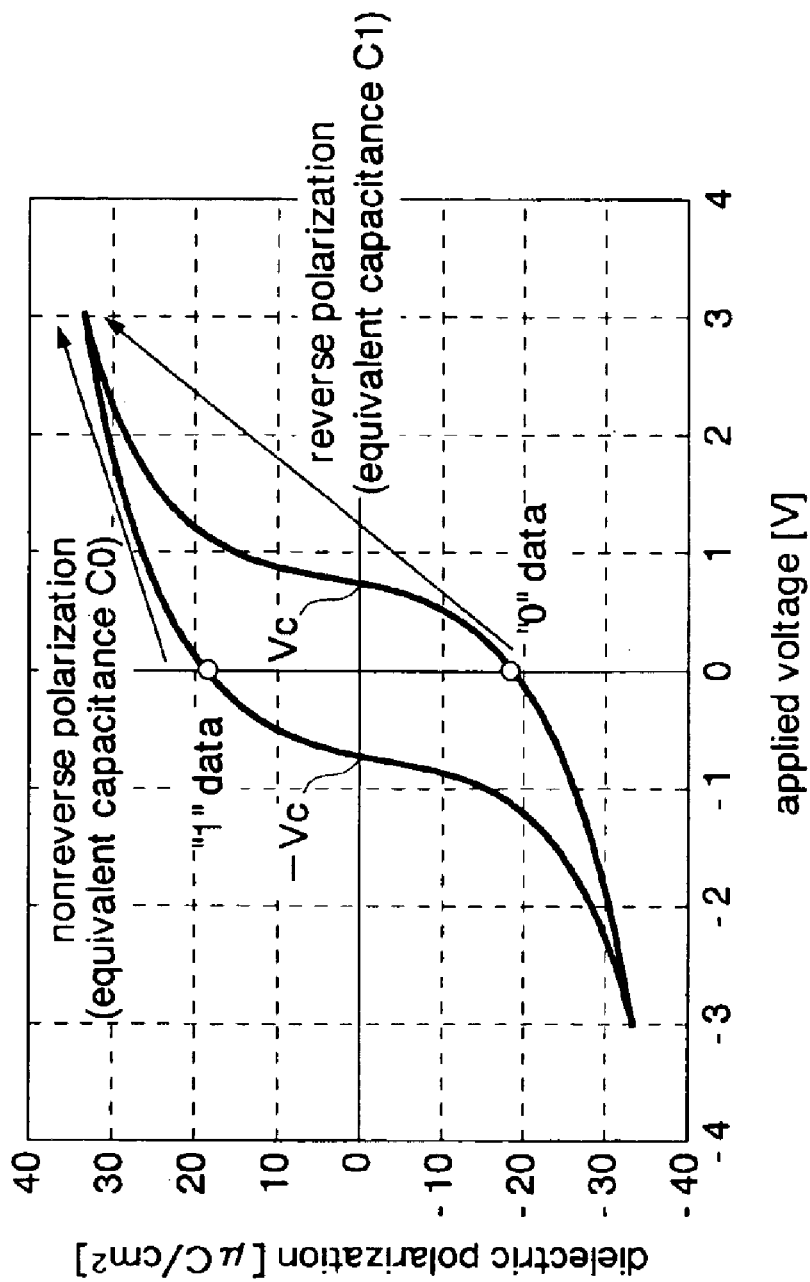
FIG. 7 is a characteristic chart showing a hysteresis loop of ferroelectric material for forming ferroelectric capacitors.

The input/output nodes (storage nodes) S1 and S2 of the latch LT are connected to bit lines BL and XBL through transfer transistors TR1 and TR2, respectively. Each memory cell MC has the same configuration as that of a conventional SRAM memory cell, excluding ferroelectric capacitors FC1 and FC2. The ferroelectric capacitors FC1 and FC2 have the same hysteresis characteristics as shown in FIG. 7 described above. The ferroelectric capacitors FC1 and FC2 thus have coercive voltages of 0.8 V in absolute value.

FIG. 10 shows the operation modes of the ferroelectric memory according to the first embodiment. In the present invention, write operations are of two types, a volatile write and a nonvolatile write. During standby and in a read operation, the same operations as in FIG. 5 described above are performed except that the voltage of the plate lines PL is different. Since the plate lines PL are not driven in a read operation, the ferroelectric capacitors FC1 and FC2 does not change their polarization as heretofore. This means no restriction on the number of reads. In response to a read command, a read operation is performed on memory cells MC that are selected by the address signal AD. That is, by a single read operation, read data is read in units of a single bit for each data terminal I/O.

A volatile write operation is a normal write operation when the system writes data to the nonvolatile SRAM. In response to a volatile write command, a volatile write operation is performed on memory cells MC that are selected by the address signal AD. That is, by a single volatile write operation, write data is written in units of a word. In other words, write data is written in units of a single bit for each data terminal I/O. The volatile write operation is the same as the write operation of FIG. 5 described above except that the voltage of the plate lines PL is fixed to L level. That is, the plate lines PL are fixed to L level (VSS), not to VDD/2 which is intermediate between the power supply voltages, or L level (VSSV) and H level (VDDV= VDD), of the latches LT. Due to this setting, in volatile write operations, the voltage (3.3 V) exceeding the coercive voltage (0.8 V) is applied between the electrodes of the ferroelectric capacitors FC1 and FC2. Nevertheless, as will be described later, reverse polarization occurs only in the first volatile write operation after power-on. This means no restriction on the number of writes in terms of volatile writes.

Incidentally, the data written to the memory cells MC by volatile write operations is retained in the latches LT while the power supply voltage VDD is supplied. In turning off the power supply, a nonvolatile write to be described later is performed so that the nonvolatile SRAM retains the written data even after the power supply is turned off. The memory cells MC of the nonvolatile SRAM according to the present invention have the same structure as in conventional SRAMs except the presence of the ferroelectric capacitors FC1 and FC2. On the other hand, intermediate data during calculation need not always be stored in a nonvolatile fashion. The nonvolatile storing has only to be performed before the power supply given to the nonvolatile SRAM is turned off. The read access time can thus be made equivalent to that of conventional SRAMs.

In a nonvolatile write operation (store operation), the bit lines BL and XBL are precharged as in standby while the word lines WL are deselected (L level) and the plate lines PL are changed from L level (VSS) to H level (VDD). Then, the data retained in all the latches LT in the memory array 32 is written to the ferroelectric capacitors FC1 and FC2 in a nonvolatile fashion. That is, in response to a nonvolatile write command, a nonvolatile write operation is performed on all the memory cells MC of the memory array 32. The polarization information written to the memory cells MC by the nonvolatile write operation is retained even after the supply of the power supply voltage VDD is stopped. Since the data of the entire memory cells MC can be written in a nonvolatile fashion to the ferroelectric capacitors FC1 and FC2 by a single nonvolatile write operation, the power-off control of the system accessing the nonvolatile SRAM can be greatly simplified. As a result, the system efficiency improves with a reduction in system cost.

A recall operation is the same as in FIG. 5 except the voltage of the plate lines PL. The plate lines PL are changed from L level (VSS) to H level (VDD) during a recall operation. The plate lines PL are driven to cause voltage differences between the input/output nodes S1 and S2 of the latches LT. Subsequently, the power supply control circuit 22 turns on the power supply (VDDV, VSSV) of the latches LT, so that all the latches LT in the memory array 32 latch the original data. The recall operation is performed when the power supply control circuit 22 detects that the power supply voltage VDD rises to a predetermined value. That is, the recall operation is performed on all the memory cells MC of the memory array 32 in response to the recall command from the power supply control circuit 22. For power-off, on the other hand, the supply of the power supply voltage VDD is stopped while in a standby state. The system that controls the operation of the nonvolatile SRAM can avoid disappearance of the data stored in the nonvolatile SRAM by performing a nonvolatile write operation before every power-off operation.

Figure 11:
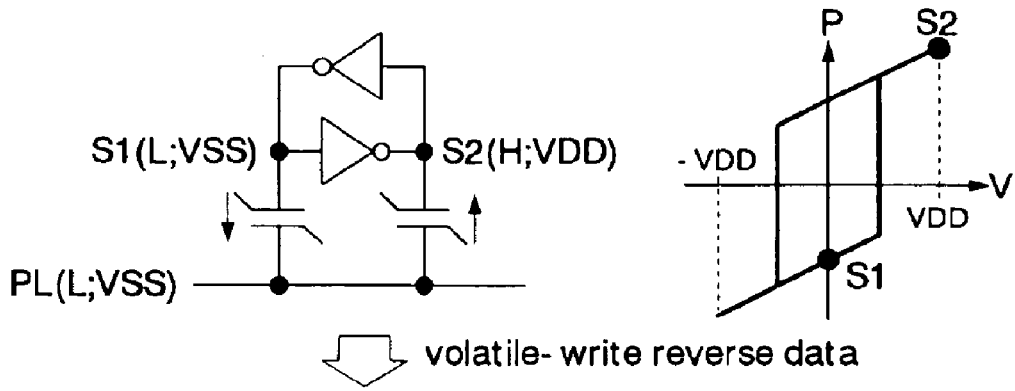
FIG. 11 is an explanatory diagram showing volatile write operations and a nonvolatile write operation of the ferroelectric memory according to the first embodiment.
Figure 11:
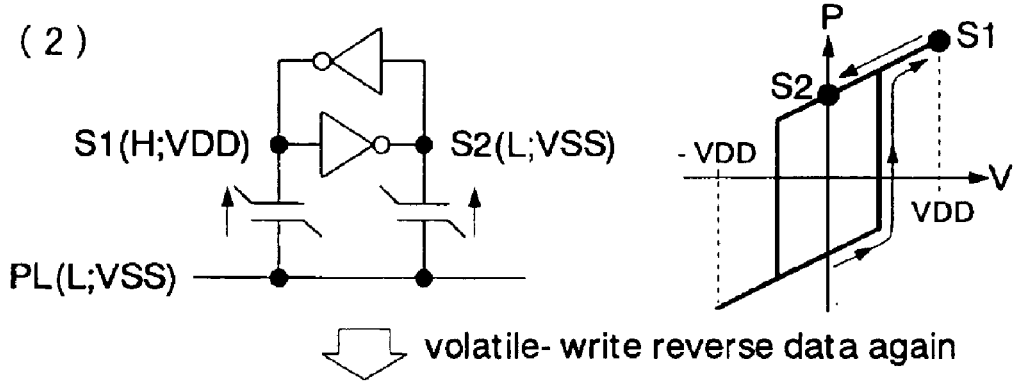
Figure 11:
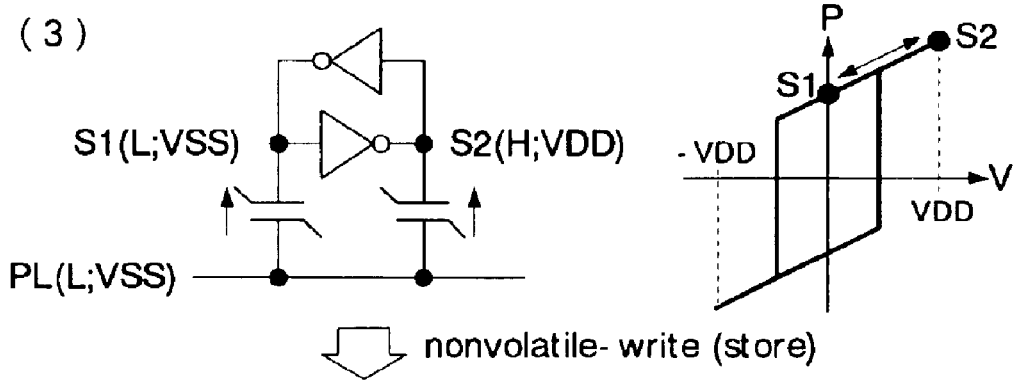
Figure 11:
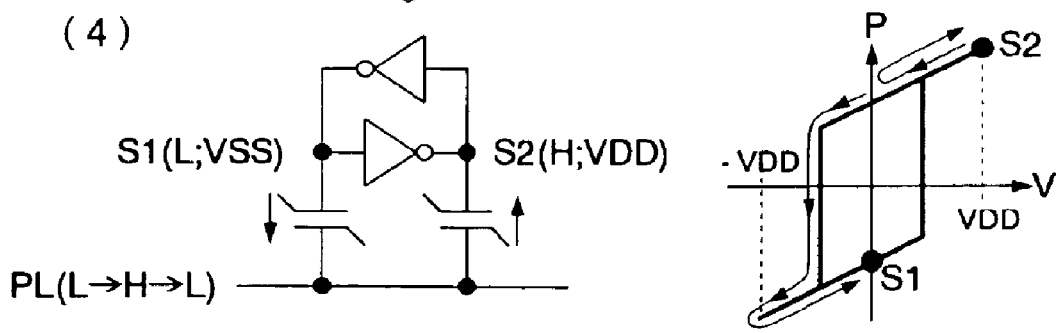

FIG. 11 shows volatile write operations and a nonvolatile write operation of the ferroelectric memory according to the first embodiment. In the diagram, the arrows attached to the ferroelectric capacitors indicate the states of polarization. The electrodes pointed by the arrows are charged positively. Initially, in FIG. 11(1), the latch LT, in a standby state after a recall operation performed in a power-on sequence, outputs L level (VSSV=VSS) and H level (VDDV=VDD) to the input/output nodes S1 and S2. As shown in FIG. 10, the plate line PL is fixed to L level (VSS) during standby. Consequently, the dielectric polarization values P of the ferroelectric capacitors FC1 and FC2 connected to the nodes S1 and S2 fall on the values corresponding to voltages V=0 V and VDD, respectively, as shown by the black circles on the hysteresis loop. Here, the voltages V are those across the electrodes of the respective ferroelectric capacitors FC1 and FC2. Hereinafter, the dielectric polarization values P of the ferroelectric capacitors connected to the nodes S1 and S2 (the black circles on the hysteresis loop in the diagram) will sometimes be referred to as polarization values S1 and S2. Here, the polarities of the polarization values S1 and S2 are shown with reference to the voltage of the plate line PL.

Next, as shown in FIG. 11(2), data reverse to the data retained in the latch LT is written in a volatile fashion. Here, the voltage of the plate line PL is maintained at L level as in the case of standby. The input/output nodes S1 and S2 change to H level (VDD) and L level (VSS) according to the power supply voltage VDDV (=VDD) and the ground voltage VSSV (=VSS) supplied to the latch LT, respectively. A voltage (3.3 V or 1.8 V) higher than the coercive voltage (in this example, 0.8 V) is applied between the electrodes of the ferroelectric capacitor connected to the node S1. Thus, the polarization value S1 changes from the negative value to a positive value corresponding to the voltage VDD on the hysteresis loop. That is, in the first volatile write operation of reverse data after a recall operation, one of the ferroelectric capacitors causes reverse polarization. Consequently, the data (polarization information) stored in the ferroelectric capacitors disappears. Nevertheless, the data written newly to the memory cell MC is retained in the latch, so that the data is retained by the entire memory cell. Incidentally, as will be described later, the ferroelectric capacitors will not cause any reverse polarization in subsequent volatile write operations.

As shown in FIG. 11(3), when reverse data is written in a volatile fashion again, the data stored in the latch LT is inverted. The input/output nodes S1 and S2 change to H level (VDD) and L level (VSS), respectively. The polarization values S1 and S2 move to the positions corresponding to voltages V=0 V and VDD, respectively, both of which are positive values. The voltages of the input/output nodes S1 and S2 always remain above the voltage of the plate line PL even when the data to be written to the latch LT is inverted in logic. Since the polarization values S1 and S2 are positive values and the voltages across the electrodes of the ferroelectric capacitors will not become negative voltages, there occurs no reverse polarization even though the voltage exceeding the coercive voltage is always applied to the ferroelectric capacitors. Subsequently, the dielectric polarization values S1 and S2 merely exchange their positions on the hysteresis loop when reverse data is written in a volatile fashion. That is, the ferroelectric capacitors will not cause any reverse polarization in subsequent volatile write operations. As a result, even if the voltage exceeding the coercive voltage is applied between the electrodes of the ferroelectric capacitors in volatile write operations, the ferroelectric capacitors will not cause characteristic deterioration due to material fatigue.

Then, as shown in FIG. 11(4), a nonvolatile write operation is performed to write the data retained in the latch LT into the ferroelectric capacitors. As shown in FIG. 10, the nonvolatile write operation is performed by changing the plate line PL from L level (VSS) to H level (VDD) temporarily. When the plate line PL is changed to H level, the polarization values S1 and S2 move to voltages V=−VDD and 0 V on the hysteresis loop, respectively. The ferroelectric capacitor connected to the node S1 thus causes reverse polarization. Subsequently, when the plate line PL is changed from H level to L level (VSS), the polarization values S1 and S2 move to voltages V=0 V and VDD on the hysteresis loop, respectively. Then, even when the supply of the power supply voltage VDD to the nonvolatile SRAM is stopped (power-off), the two ferroelectric capacitors of the memory cell MC store data in the states of polarization shown in FIG. 7.

Normal writes for storing write data from exterior are executed by volatile write operations in which the dielectric polarization values of the ferroelectric capacitors will not cause reverse polarization, and a nonvolatile write operation with reverse polarization is performed, for example, upon power-off alone. As a result, the frequency of reverse polarization decreases significantly as compared to heretofore. For example, when power-on and power-off are performed at every 100 μs on average, the number of times of reverse polarization is $3.2 \times 10^{12}$ for ten years. This number is smaller than $1 \times 10^{13}$, the conventional maximum number of writes. During this period, the ferroelectric capacitors will not cause characteristic deterioration. As a result, the restriction on the number of rewrites of the ferroelectric memory can be removed substantially.

Figure 12:
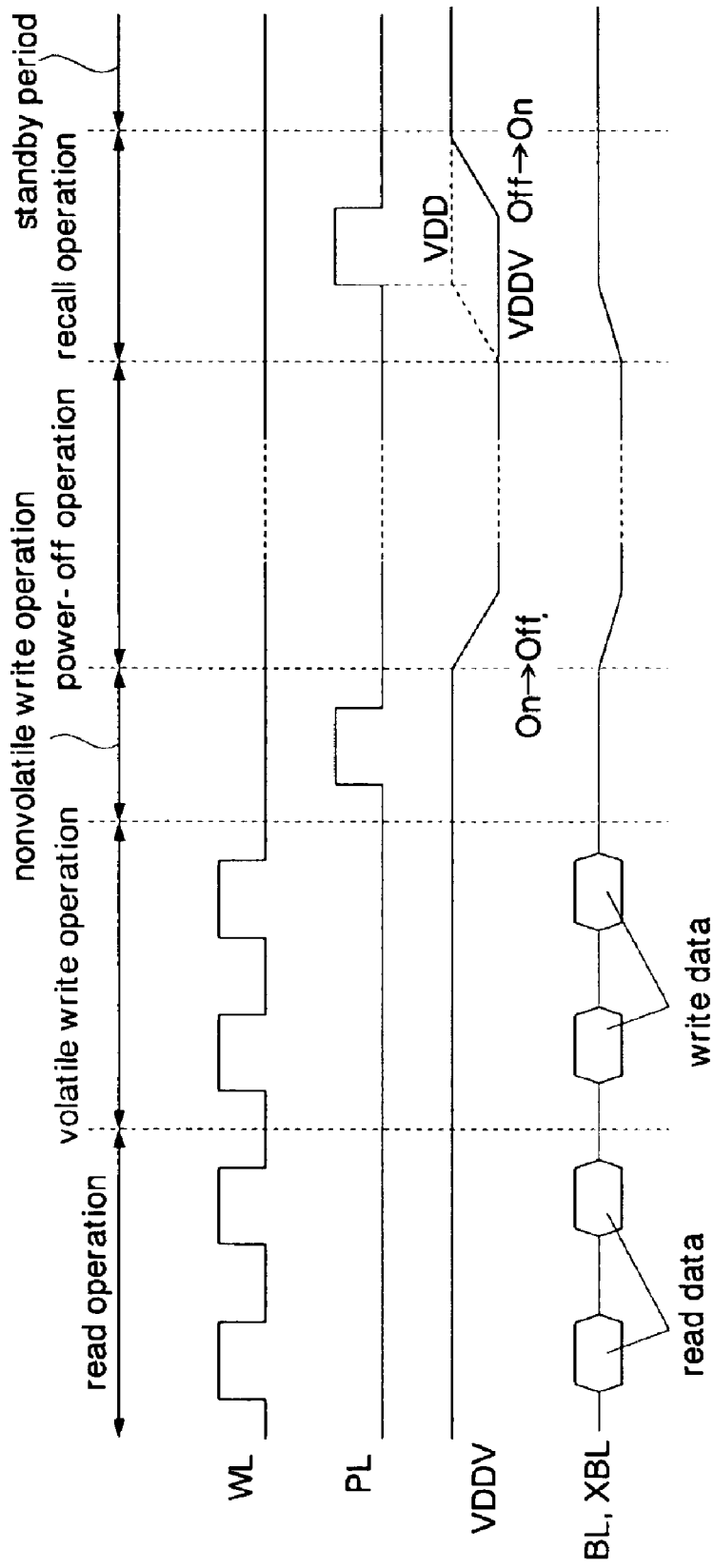
FIG. 12 is a waveform chart showing examples of operation of the ferroelectric memory according to the first embodiment.

FIG. 12 shows examples of operation of the ferroelectric memory according to the first embodiment. In the chart, the operations may be performed in any order except that a recall operation must always be performed after power-on. For example, a read operation may be performed between a volatile write operation and a nonvolatile write operation, or between a nonvolatile write operation and a power-off operation.

In a read operation, a word line WL is selected (H level) according to the address signal AD supplied to the address terminal AD, with the plate lines PL fixed to L level (VSS). The data retained in the latches LT is read to the bit lines BL and XBL as read data. In a volatile write operation, a word line WL is selected (H level) according to the address signal AD with the plate lines PL fixed to L level (VSS). Write data received at the data terminals I/O is written to the latches LT through the bit lines BL and XBL.

In a nonvolatile write operation, the plate lines PL are changed from L level (VSS) to H level (VDD) with the word lines WL deselected. The data retained in the latches LT are written to the ferroelectric capacitors FC1 and FC2. In a power-off operation, the word lines WL are deselected, the plate lines PL are set at L level (VSS), and the bit lines BL and XBL are set at a precharging voltage. In this state, the system accessing the ferroelectric memory stops the supply of the power supply voltage VDD to the power supply terminal VDD. Then, the power supply voltage VDD falls gradually, and the ferroelectric memory enters a power-off state.

In a recall operation, the system initially starts supplying the power supply voltage VDD to the power supply terminal VDD. The ferroelectric memory is initialized in the power-on resetting sequence until the power supply voltage VDD reaches a predetermined value, setting the word lines WL and the plate lines PL at L level (VSS). The power supply control circuit 22 shown in FIG. 8 outputs the recall command to the power supply control circuit 20 when it detects that the power supply voltage VDD rises to a predetermined value (for example, 3.0 V).

The power supply control circuit 20 controls the plate driver 26 in response to the recall command, thereby driving the plate lines PL from L level to H level (VDD) and to L level. Subsequently, the power supply control circuit 22 supplies the power supply voltage VDDV and the ground voltage VSSV to the latches LT. The time from the output of the recall command and the start of supply of the power supply voltage VDDV and the ground voltage VSSV is created by a delay circuit formed in the power supply control circuit 22.

The period in which none of the read operation, the volatile write operation, the nonvolatile write operation, the power-off operation, and the recall operation is performed (in this example, after the recall operation) is a standby period. During the standby period, the word lines WL and the plate lines PL are set at L level (VSS), and the bit lines BL and XBL are set at the precharging voltage.

As above, according to the present embodiment, the restriction on the number of rewrites can be removed even if a voltage exceeding the coercive voltage is applied between the electrodes of the ferroelectric capacitors FC1 and FC2 during volatile write operations. Since voltages lower than or equal to the coercive voltage need not be applied between the electrodes of the ferroelectric capacitors FC1 and FC2 during volatile write operations, the voltages to be applied to the latches LT can be reduced from conventional three types (VDD, VSS, VDD-α) to two types (VDDV, VSSV), for example. This can make the circuit for generating VDD-α unnecessary, and simplify the configuration of the circuits for controlling the switching of the voltages of the operation control circuit 20, the plate driver 26, the power supply control circuit 22, etc. The power supply wiring for VDD-α also becomes unnecessary. Since the circuit scale can be reduced with a reduction in wiring area, the nonvolatile SRAM can be made smaller in chip size with a reduction in fabrication cost.

Since the data of all the memory cells MC can be written to the ferroelectric capacitors FC1 and FC2 simply by performing a single nonvolatile write operation, the power-off control of the system accessing the nonvolatile SRAM can be simplified. As a result, the system efficiency can be improved with a reduction in system cost.

Since volatile write operations and nonvolatile write operations are performed in response to the commands supplied from exterior of the nonvolatile SRAM, the system accessing the nonvolatile SRAM can perform volatile writes and nonvolatile writes with complete control. As a result, the frequency of nonvolatile write operations can be minimized to the system, allowing an improvement of the system performance.

When the nonvolatile SRAM is powered on, a recall operation can be automatically performed to reduce the load on the system accessing the nonvolatile SRAM with an improvement of the system performance.

Figure 13:
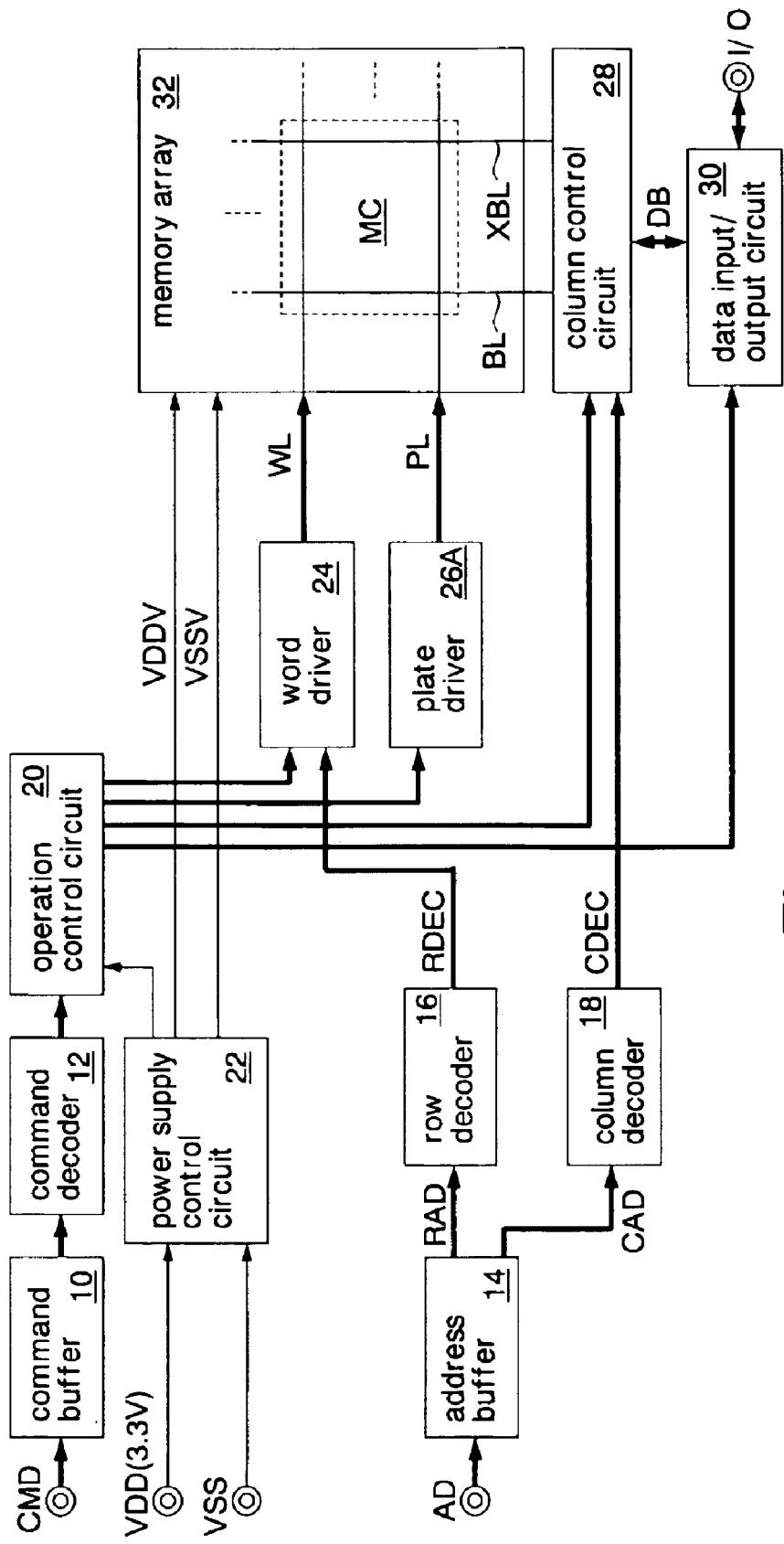
FIG. 13 is a block diagram showing a second embodiment of the ferroelectric memory according to the present invention.

FIG. 13 shows a second embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, a plate driver 26A is formed instead of the plate driver 26 of the first embodiment. The rest of the configuration is almost the same as in the first embodiment.

FIG. 14 shows the operation modes of the ferroelectric memory according to the second embodiment. This embodiment differs from the first embodiment in the voltages of the plate lines PL which the plate driver 26A outputs during standby, in a read operation, in a volatile write operation, in a nonvolatile write operation, and in a recall operation. The voltages of the power supply VDD, the bit lines BL and XBL, and the word lines WL are the same as in the first embodiment (FIG. 10).

During standby, in a read operation, and in a volatile write operation, the voltage of the plate lines PL is set at fixed H level (VDD=3.3 V). That is, the plate lines PL are fixed to H level (VDD), not to VDD/2 which is intermediate between the power supply voltages, or L level (VSSV=VSS) and H level (VDDV=VDD), of the latches LT. In other words, during a volatile write operation, a voltage (3.3 V) exceeding the coercive voltage (0.8 V) is applied between the electrodes of the ferroelectric capacitors FC1 and FC2. Due to this setting, the voltages of the input/output nodes (storage nodes) S1 and S2 of the latches LT always remain below the plate-line voltage even if the logic of data to be written to the latches LT is inverted in volatile write operations. Consequently, as in the first embodiment, the ferroelectric capacitors FC1 and FC2 will not cause any reverse polarization in second and subsequent volatile write operations. This can eliminate the restriction on the number of volatile writes.

In a nonvolatile write operation, the voltage of the plate lines PL is changed inversely to that of the first embodiment, or from H level (VDD) to L level (VSS), whereby the data is stored into the ferroelectric capacitors FC1 and FC2. In a recall operation, the voltage of the plate lines PL is changed from L level (VSS) to H level (VDD) temporarily, reading data from the ferroelectric capacitors FC1 and FC2 to the latches LT. After the recall operation, the voltage of the plate lines PL is changed to H level in order to enter a standby state.

Figure 15:
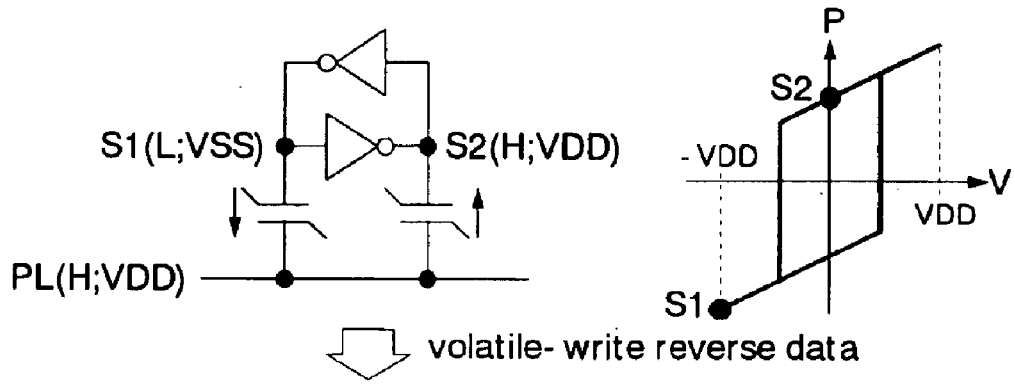
FIG. 15 is an explanatory diagram showing volatile write operations and a nonvolatile write operation of the ferroelectric memory according to the second embodiment.
Figure 15:
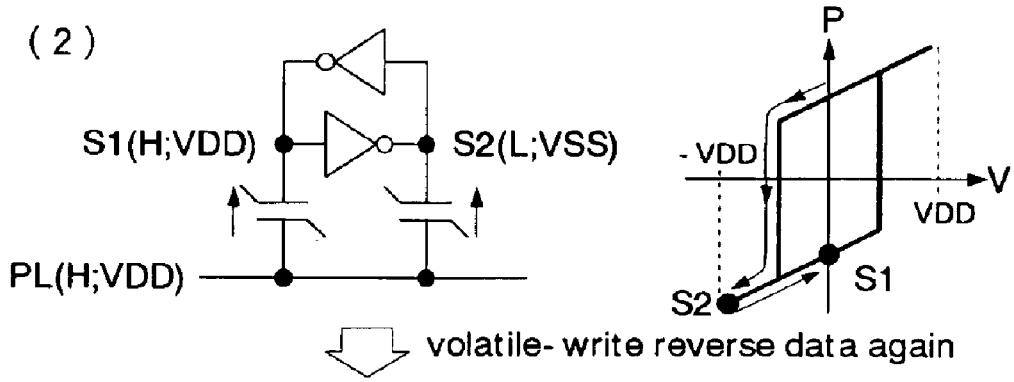
Figure 15:
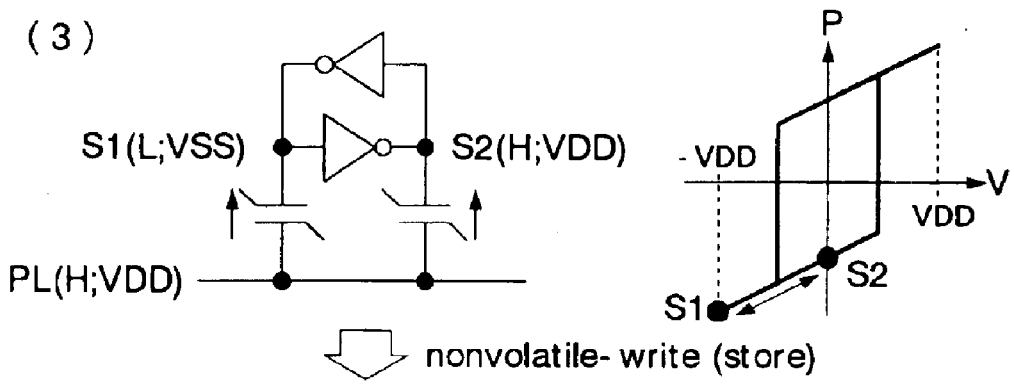
Figure 15:
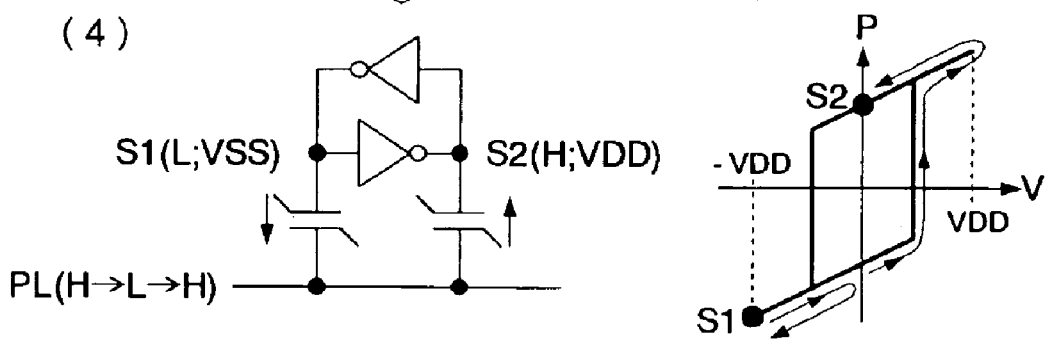

FIG. 15 shows volatile write operations and a nonvolatile write operation according to the second embodiment. Detailed description will be omitted of the same operations as in the first embodiment (FIG. 11). In this embodiment, during a volatile write operation, the voltage of the plate lines PL is maintained at H level which is inverse to that of the first embodiment. During a nonvolatile write operation, the voltage of the plate lines PL is changed inversely to that of the first embodiment, or from H level to L level and to H level in succession. Consequently, on the hysteresis loops of (1) to (4) in the diagram, the dielectric polarization values S1 and S2 move to the positions symmetrical to those of FIG. 11 with respect to the point of origin, the dielectric polarization values S1 and S2 being exchanged each other.

As described above, during a volatile write operation, a voltage exceeding the coercive voltage is applied between the electrodes of the ferroelectric capacitors. As in the case of the first embodiment, when data reverse to that retained in a latch LT requires polarization change for the first time after a recall operation, a voltage (−3.3 V) lower than the coercive voltage (in this example, −0.8 V) is thus applied between the electrodes of the ferroelectric capacitor connected to the node S2 as shown in FIG. 15(2). Consequently, the polarization value S2 changes from the positive value to a negative value corresponding to the voltage −VDD on the hysteresis loop. That is, one of the ferroelectric capacitors causes reverse polarization only in the first volatile write operation of reverse data after a recall operation. The data (polarization information) stored in the ferroelectric capacitors thus disappears. Nevertheless, the data written newly to the memory cell MC is retained in the latch, so that the data is retained by the entire memory cell.

As shown in FIG. 15(3), both the polarization directions S1 and S2 does not change within the negative domain in subsequent volatile write operations. Since the polarization values S1 and S2 are negative values and the voltages across the electrodes of the ferroelectric capacitors will not become positive voltages, there causes no polarization change even though the voltage exceeding the coercive voltage is always applied to the ferroelectric capacitors. Subsequently, the dielectric polarization values S1 and S2 merely exchange their positions on the hysteresis loop when reverse data is volatile-written. Consequently, as in the first embodiment, even if the voltage exceeding the coercive voltage is applied between the electrodes of the ferroelectric capacitors in volatile write operations, the ferroelectric capacitors will not cause characteristic degradation.

Subsequently, as shown in FIG. 15(4), a nonvolatile write operation is performed to write the data retained in the latch LT into the ferroelectric capacitors. As shown in FIG. 14, the nonvolatile write operation is performed by changing the plate line PL from H level (VDD) to L level (VSS). When the plate line PL is changed to L level, the polarization values S1 and S2 move to voltages V=0 V and VDD on the hysteresis loop, respectively. The ferroelectric capacitor connected to the node S2 thus causes polarization change. Subsequently, when the plate line PL is changed from L level to H level, the polarization directions S1 and S2 change according to voltages of V=−VDD and 0 V on the hysteresis loop, respectively. Then, since the polarization values S1 and S2 change to negative and positive, the data retained in the latch LT is written to the ferroelectric capacitors.

Figure 16:
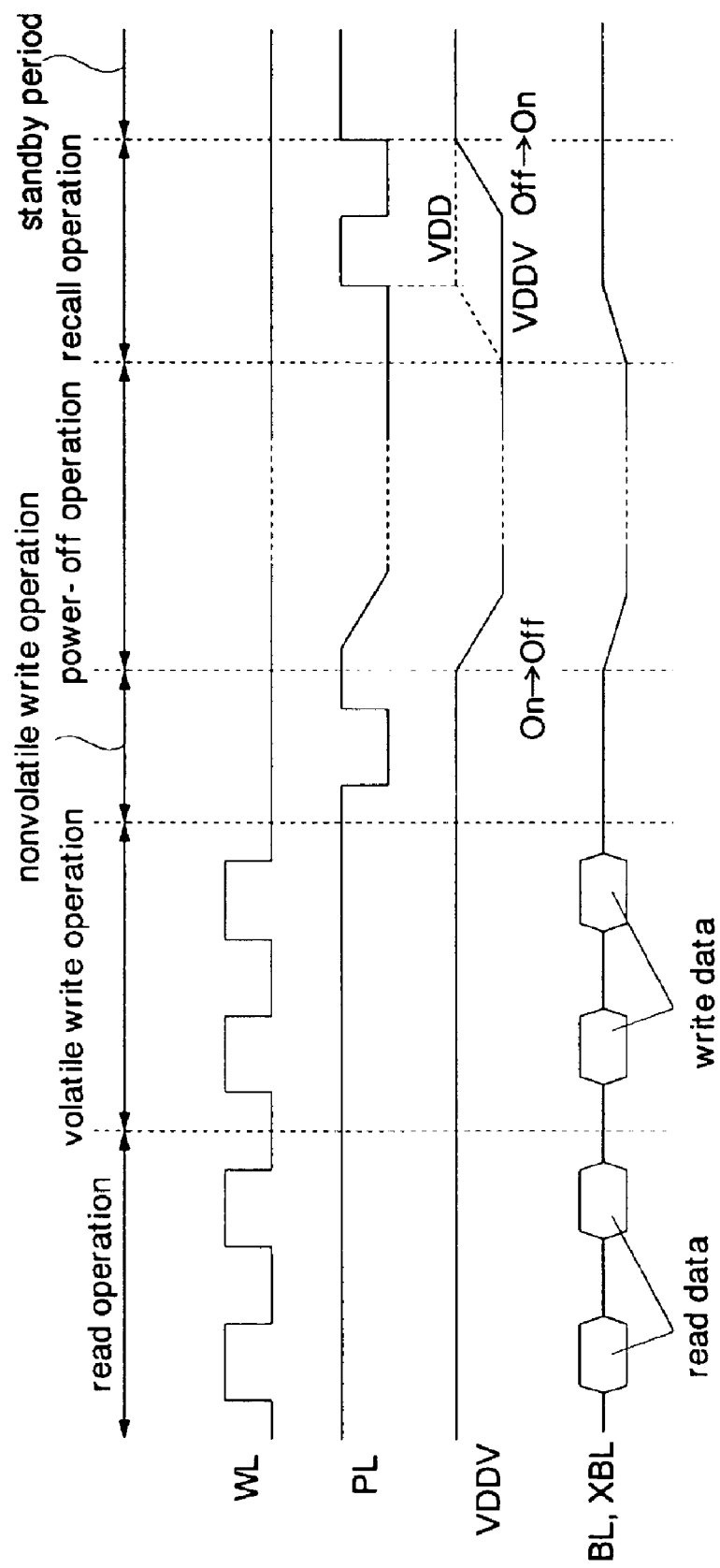
FIG. 16 is a waveform chart showing examples of operation of the ferroelectric memory according to the second embodiment.

FIG. 16 shows examples of operation of the ferroelectric memory according to the second embodiment. In the chart, the operations may be performed in any order except that a recall operation must always be performed after power-on. Differences from the first embodiment (FIG. 12) consist in that the plate lines PL change from H level (VDD) to L level (VSS) for a predetermined period in a nonvolatile write operation, and that the plate lines PL change into a standby state, or H level, after a recall operation. The rest of the operations are the same as in the first embodiment.

As above, this embodiment can provide the same effects as those of the first embodiment described above. Moreover, in this embodiment, the voltage of the plate lines PL is fixed to H level during a volatile write operation. This can eliminate the restriction on rewrites in terms of volatile write operations even when a voltage exceeding the coercive voltage is applied between the electrodes of the ferroelectric capacitors.

Figure 17:
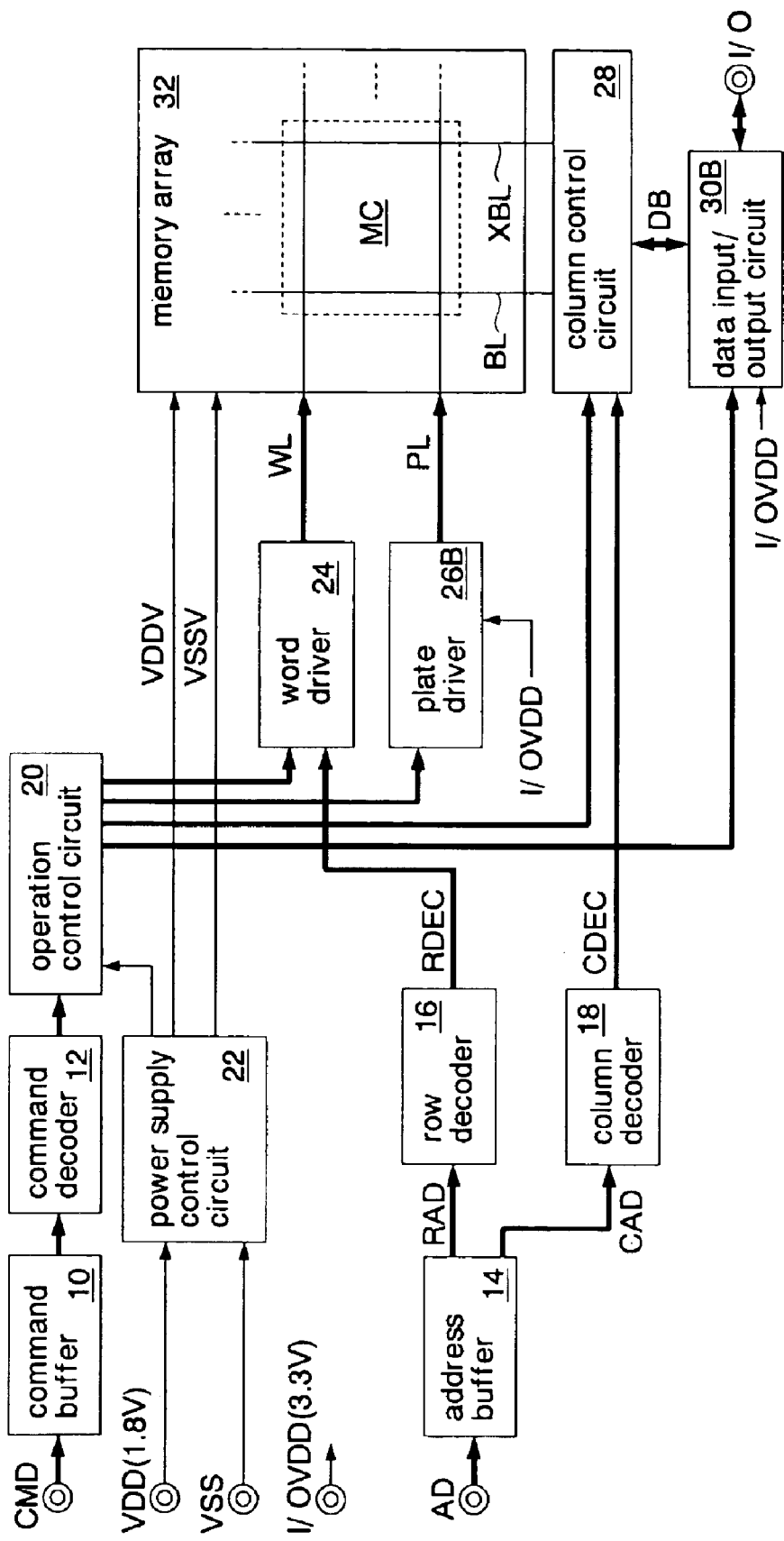
FIG. 17 is a block diagram showing a third embodiment of the ferroelectric memory according to the present invention.

FIG. 17 shows a third embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, a plate driver 26B and a data input/output circuit 30B are formed instead of the plate driver 26 and the data input/output circuit 30 of the first embodiment. In addition, a power supply terminal I/OVDD for receiving a power supply voltage I/OVDD (for example, 3.3 V) for I/O is formed. The power supply voltage I/OVDD is used as the power supply of a data input circuit and a data output circuit formed in the data input/output circuit 30B. The power supply voltage I/OVDD is also supplied to the plate driver 26B and used as the H-level voltage of the plate lines PL. The rest of the configuration is almost the same as in the first embodiment except that the power supply voltage VDD is 1.8 V.

This embodiment has the same operation modes as those of the first embodiment (FIG. 10) except that the H level of the plate lines PL in a nonvolatile write operation (store operation) and a recall operation is using the power supply voltage from I/OVDD. That is, during a volatile write operation, a voltage (VDD=1.8 V) higher than the coercive voltage (0.8 V) is applied between the electrodes of either one of the ferroelectric capacitors. Besides, the H-level voltage of the plate lines PL is set higher than the power supply voltage VDDV (=VDD) (1.8 V; the source voltage of the pMOS transistors) of the latches LT in the memory cells MC. During a nonvolatile write operation, the driving voltage of the plate lines PL is made higher than the power supply voltage VDDV of the memory cells MC so that data can be written to the ferroelectric capacitors with higher intensity. The voltage across the electrodes of each ferroelectric capacitor FC1, FC2 can thus be reduced relatively during standby, during a read operation, and during a volatile write operation. Consequently, it is possible to reduce the imprint effect of shifting the hysteresis loops of the ferroelectric capacitors in the direction of the voltage axis. Moreover, during a recall operation, the driving voltage of the plate lines PL can be raised to increase the voltage differences occurring between the input/output nodes (storage nodes) S1 and S2 of the latches LT, thereby improving the operating margin of the nonvolatile SRAM. Incidentally, the higher driving voltage of the plate lines PL has the effect of restoring imprinted ferroelectric material to original properties.

As above, this embodiment can provide the same effects as those of the first embodiment described above. Besides, in this embodiment, the voltage across the electrodes of each ferroelectric capacitor FC1, FC2 can be reduced relatively during standby, during a read operation, and during a volatile write operation. This allows a reduction of the imprint effect. As a result, the nonvolatile SRAM can be improved in operating margin. Generating the H-level voltage of the plate lines PL by using the I/O power supply voltage eliminates the need for a voltage boost circuit or the like.

This can avoid an increase in circuit scale. That is, the imprint effect can be reduced without an increase in chip cost.

Figure 18:
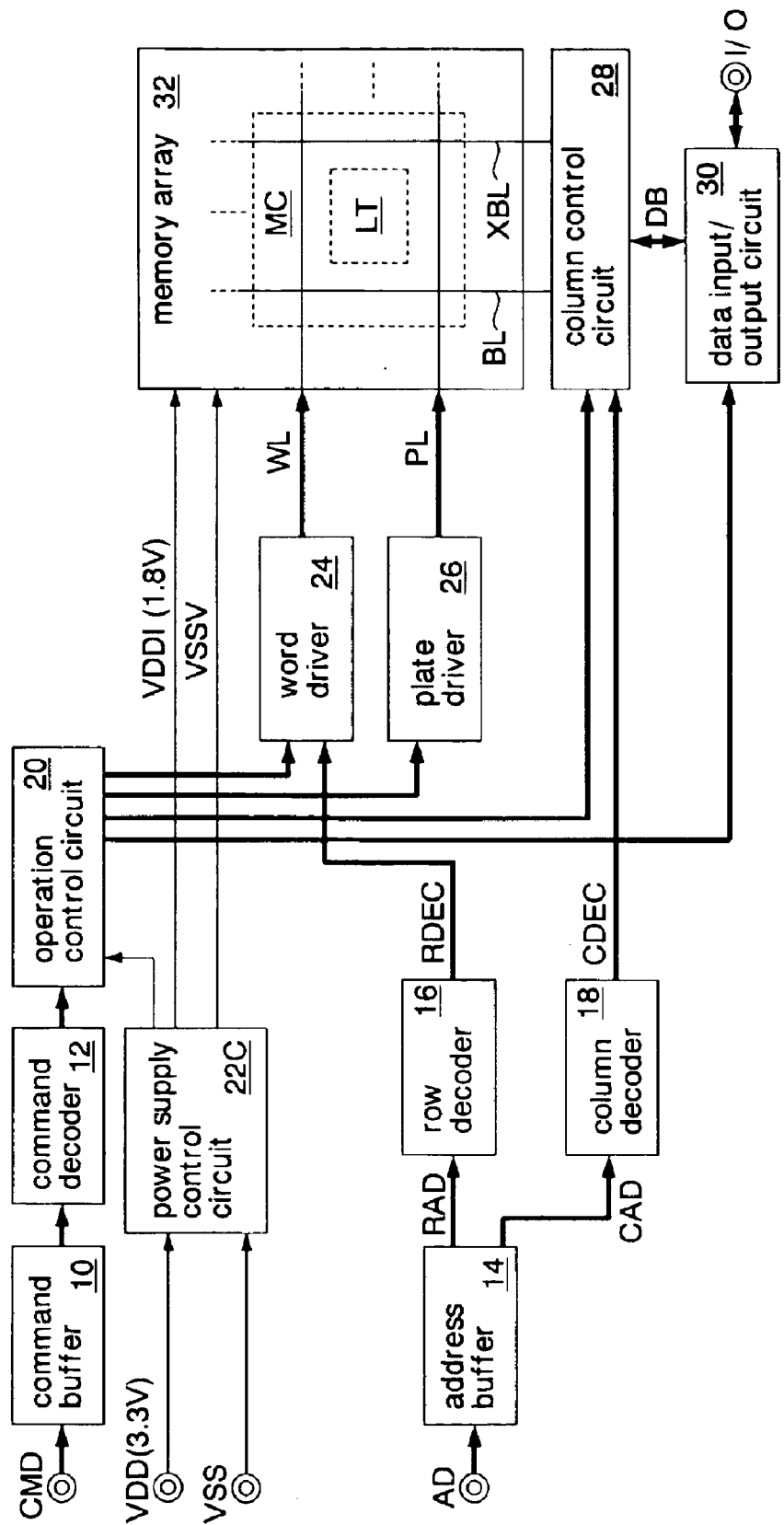
FIG. 18 is a block diagram showing a fourth embodiment of the ferroelectric memory according to the present invention.

FIG. 18 shows a fourth embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone.

In this embodiment, a power supply control circuit 22C is formed instead of the power supply control circuit 22 of the first embodiment. The power supply voltage VDD supplied to the power supply terminal VDD is 3.3 V. The rest of the configuration is almost the same as in the first embodiment. The power supply control circuit 22C has the function of converting the power supply voltage VDD of 3.3 V into an internal supply voltage VDDI of 1.8 V, in addition to the functions of the power supply control circuit 22 of the first embodiment. The internal supply voltage VDDI is supplied to the power supply terminals of the latches LT in the memory cells MC (the sources of the PMOS transistors).

The plate driver 26 outputs the power supply voltage VDD (3.3 V) or the ground voltage VSS to the plate lines PL. Among the operation modes of this embodiment, a nonvolatile write operation (store operation) and a recall operation set the H level of the plate lines PL at 3.3 V. The operation voltage of the other essential circuits is 1.8 V. Consequently, as in the case of the third embodiment, the voltage across the electrodes of each ferroelectric capacitor FC1, FC2 can be reduced relatively during standby, during a read operation, and during a volatile write operation. This allows a reduction of the imprint effect.

As above, this embodiment can provide the same effects as those of the first and third embodiments described above. Moreover, in this embodiment, the power supply voltage VDD supplied from exterior of the nonvolatile SRAM is used as the H-level voltage of the plate lines PL. The plate-line voltage higher than the internal supply voltage VDDI to be supplied to the memory cells MC can thus be generated easily.

Figure 19:
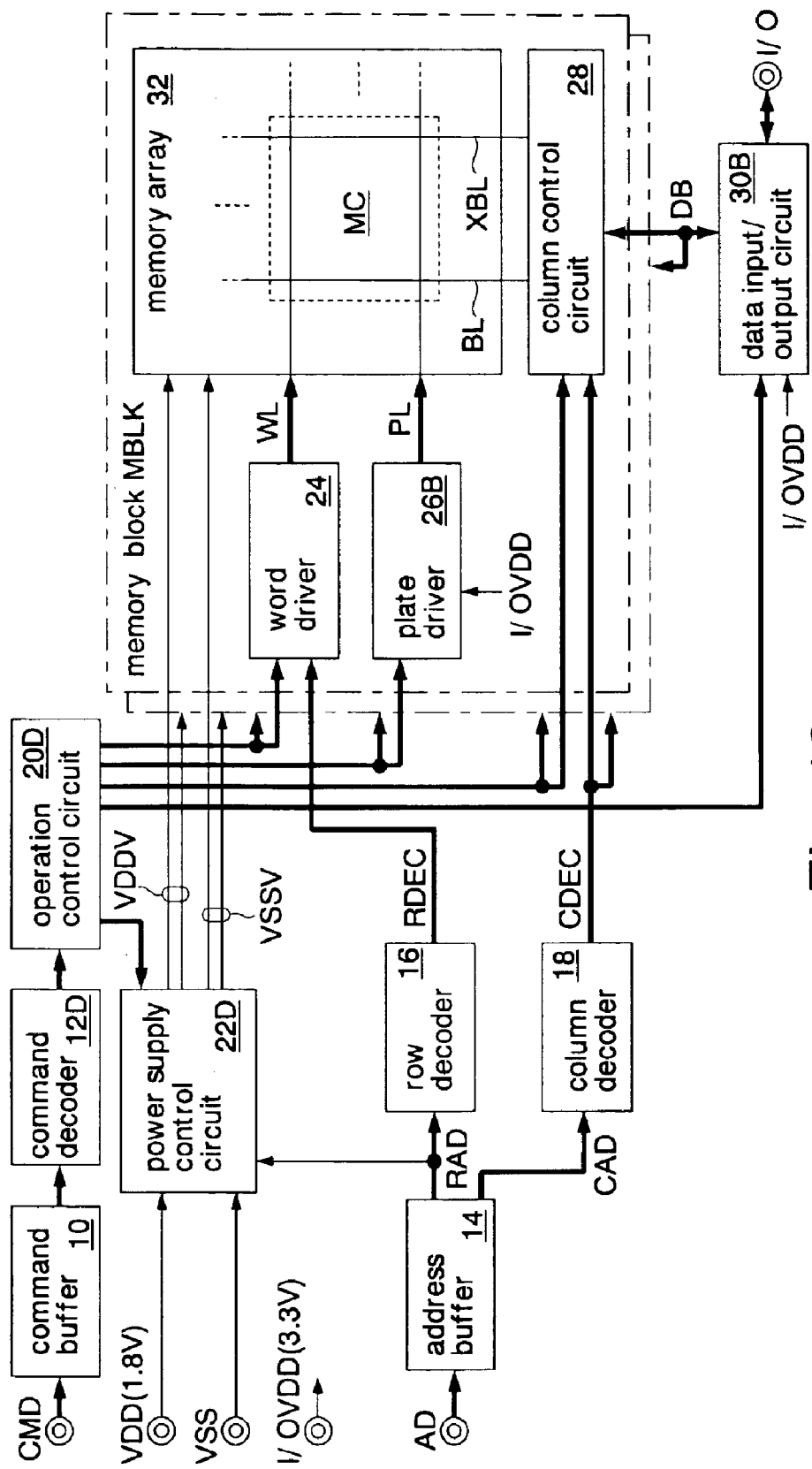
FIG. 19 is a block diagram showing a fifth embodiment of the ferroelectric memory according to the present invention.

FIG. 19 shows a fifth embodiment of the ferroelectric memory of the present invention. The same elements as those described in the first and third embodiments will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, a command decoder 12D, an operation control circuit 20D, a power supply control circuit 22D, and the plate driver 26B and data input/output circuit 30B of the third embodiment are formed instead of the command decoder 12, the operation control circuit 20, the power supply control circuit 22, the plate driver 26, and the data input/output circuit 30 of the first embodiment.

The nonvolatile SRAM has a plurality of memory blocks MBLK (in this example, two). The memory blocks MBLK have a word driver 24, a plate driver 26B, a memory array 32, and a column control circuit 28 each, and operate independent of each other under the control of the operation control circuit 20D. In addition, the nonvolatile SRAM has a power supply terminal I/OVDD for receiving a power supply voltage I/OVDD (for example, 3.3 V) for I/O. The rest of the configuration is almost the same as in the third embodiment.

The command decoder 12D has the function of decoding a power-on command, a power-off command, and a recall command for performing a recall operation, and notifying the operation control circuit 20D of the result, in addition to the functions of the command decoder 12 of the first embodiment. These commands are sent to the dedicated command terminals.

In order to perform a read operation, a volatile write operation, a nonvolatile write operation, and a recall operation in response to the decoding result of the command decoder 12D, the operation control circuit 20D outputs control signals to the word driver 24, the plate driver 26B, the column control circuit 28, and the data input/output circuit 30 in the memory block MBLK selected by the most significant bit of the row address signal RAD. The operation control circuit 20D also controls the power supply control circuit 22D in response to the power-on command and the power-off command, thereby performing a power-on operation and a power-off operation with respect to each of the memory blocks MBLK. The operation control circuit 20D has the same functions as those of the operation control circuit 20 of the first embodiment except that it outputs the control signals by each memory block MBLK according to the row address signal RAD, and that it controls the power supply control circuit 22D in response to the power-on command and the power-off command.

The power supply control circuit 22D receives the power supply voltage VDD and the ground voltage VSS supplied to the power supply terminals VDDV (=VDD) and VSSV (=VSS), the control signals from the operation control circuit 20D (the power-on command and the power-off command), and the level of the most significant bit of the row address signal RAD from the address buffer 14. According to the control signals and the row address signal RAD, the power supply control circuit 22D provides or stops the supply of the power supply voltage VDDV and the ground voltage VSSV to the memory blocks MBLK.

FIG. 20 shows the operation modes of the ferroelectric memory according to the fifth embodiment. Detailed description will be omitted of the same operations as in the first embodiment (FIG. 10). The operation modes are shown for each memory block MBLK. That is, the individual operations shown in the operation modes are performed with respect to each of the memory blocks MBLK. For example, a read operation and a volatile write operation are performed on the memory block MBLK selected by the row address signal RAD, in units of a single bit for each data terminal I/O. A nonvolatile write operation (block store) and a recall operation (block recall) are performed on all the bits of the memory block MBLK selected by the row address signal RAD. In each of the operations, the power supply lines and signal lines are in the same states as in the third embodiment. That is, during a volatile write operation, a voltage (3.3 V) exceeding the coercive voltage (0.8 V) is applied between the electrodes of the ferroelectric capacitors.

To stop the supply of the power supplies VDD and VSS to the memory array 32 of a desired memory block MBLK, the system accessing the nonvolatile SRAM performs a nonvolatile write operation before it designates the memory block MBLK with the address signal AD and issues the power-off command. The power-off command stops to supply the power supplies VDD (VDDV) and VSS (VDDS) to the memory cells MC in the selected memory block MBLK.

Note that the supply of the power supplies VDD and VSS to other blocks except for the memory block MBLK (the word driver 24 etc.) is not stopped here. Stopping the supply of the power supplies VDD and VSS to the memory cells MC can eliminate leakage currents between the power supplies VDDV and VSSV of the latches LT, and can eliminate leakage currents in the memory cells MC. Thus, the supply of the power supplies VDDV and VSSV to the memory array 32 of the memory block MBLK not being accessed can be stopped to reduce the standby current greatly.

As above, this embodiment can provide the same effects as those of the first and third embodiments described above. Besides, in this embodiment, the power supplies VDDV and VSSV of the memory arrays 32 can be controlled on/off with respect to each of the memory blocks MBLK, with a reduction in the standby current (power consumption) of the nonvolatile SRAM.

The system accessing the nonvolatile SRAM can stop the supply of the power supply voltages to a desired memory block MBLK easily by sending the power-off command to the nonvolatile SRAM along with the address signal AD. Similarly, the system can supply the address signal AD and the recall command to the nonvolatile SRAM to perform a recall operation on a desired memory block MBLK so that the memory block MBLK shifts from a power-off state to a standby state. Since the power supply can be given to only the memory block(s) MBLK required by the system, the system can fine adjust the power consumption of the nonvolatile SRAM.

Figure 21:
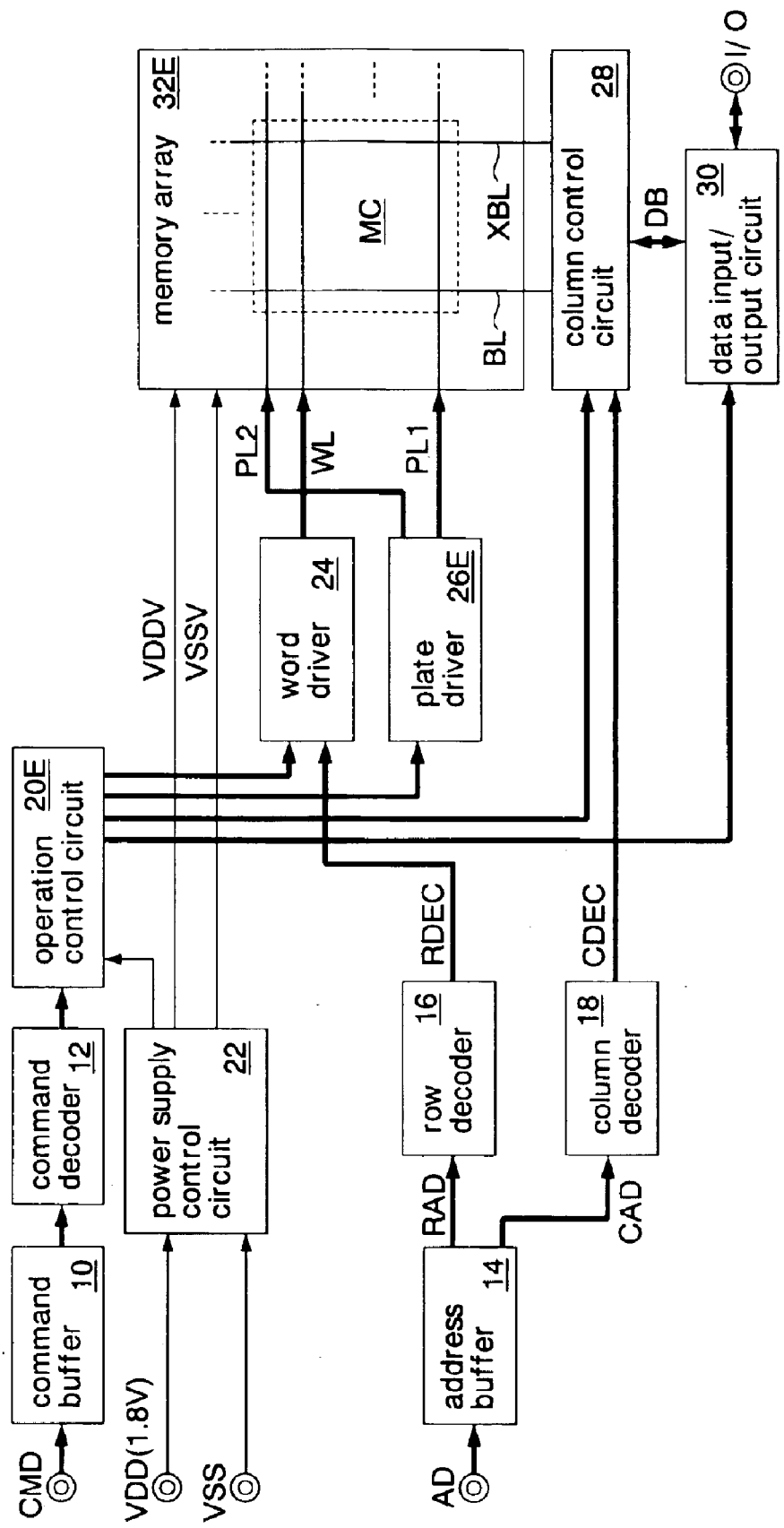
FIG. 21 is a block diagram showing a sixth embodiment of the ferroelectric memory according to the present invention.

FIG. 21 shows a sixth embodiment of the ferroelectric memory of the present invention. The same elements as those described in the first embodiment will be designated by identical reference numbers or symbols. Detailed description thereof will be omitted. In this embodiment, an operation control circuit 20E, a plate driver 26E, and a memory array 32E are formed instead of the operation control circuit 20, the plate driver 26, and the memory array 32 of the first embodiment. The rest of the configuration is almost the same as in the first embodiment.

In this embodiment, the memory array 32E is composed of 6T4C type memory cells MC. Thus, the plate driver 26E supplies voltages to two plate lines PL1 and PL2 according to a control signal from the operation control circuit 20E. The nonvolatile SRAM makes the same operations as in the first embodiment except in the method of driving the plate lines PL1 and PL2. The operation control circuit 20E has the same functions as those of the operation control circuit 20 of the first embodiment except in the control signal it outputs to the plate driver 26E.

Figure 22:
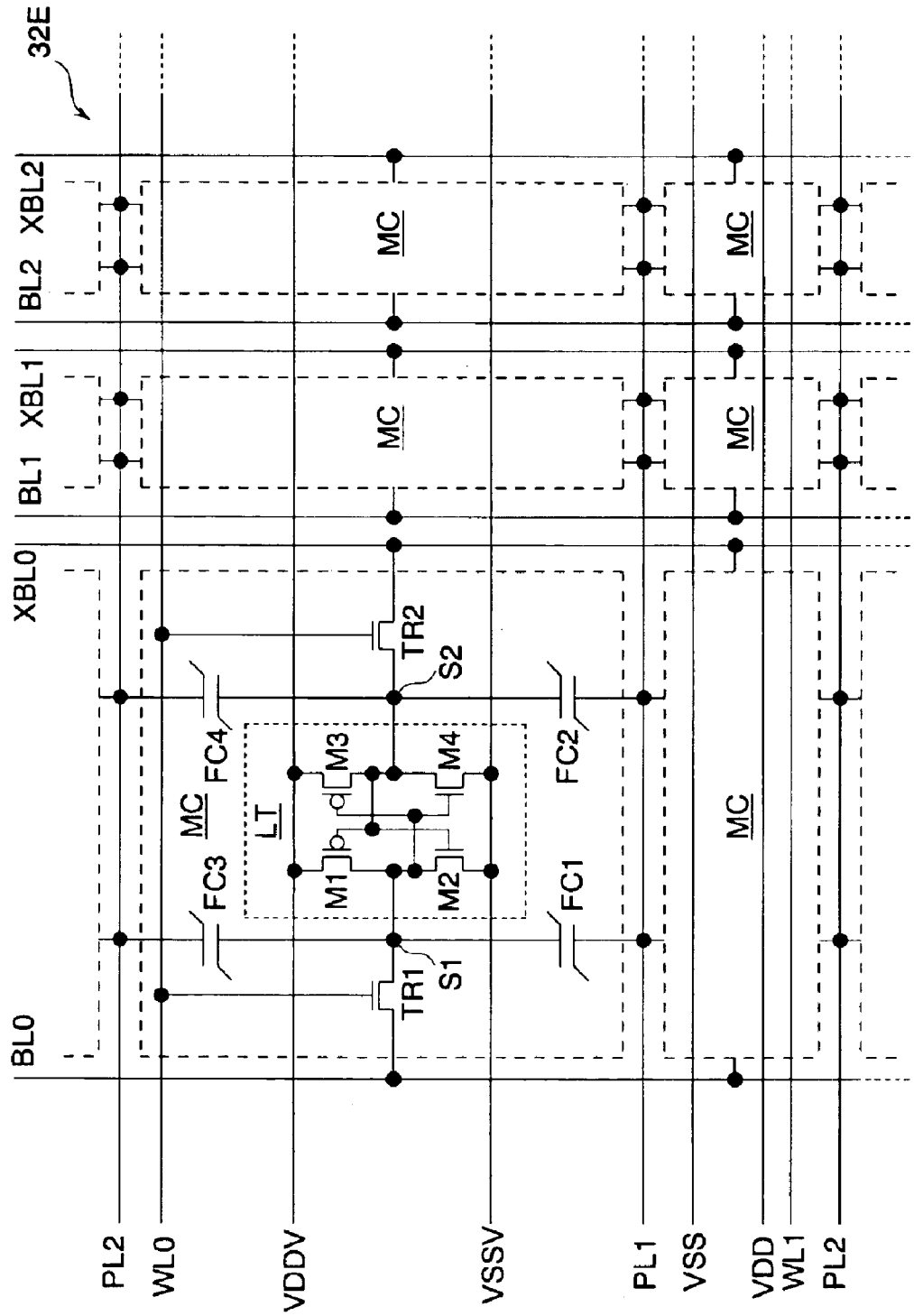
FIG. 22 is a circuit diagram showing the details of the memory array shown in FIG. 21.

FIG. 22 shows the details of the memory array 32E shown in FIG. 21. The plate lines PL1 and PL2 are connected commonly to all the memory cells MC. The rest of the configuration is the same as in the fifth embodiment (FIG. 9).

FIG. 23 shows the operation modes of the ferroelectric memory according to the sixth embodiment. The types of the operation modes and the states of the power supply VDD, the bit lines BL and XBL, and the word lines WL in the respective operation modes are the same as in the first embodiment (FIG. 10). The states of the plate lines PL1 are the same as those of the plate lines PL in the first embodiment. The states of the plate lines PL2 are the same as those of the plate lines PL1 except that they are maintained at L level during a recall operation.

In a read operation and a volatile write operation, the plate lines PL1 and PL2 are not driven. Thus, the ferroelectric capacitors FC1–FC4 will not cause any reverse polarization except in the first volatile write operation after power-on. This means no restriction on the number of reads and the number of writes. Incidentally, as in the first embodiment, a voltage exceeding the coercive voltage (0.8 V) is applied between the electrodes of the ferroelectric capacitors FC1–FC4 during a volatile write operation.

In a nonvolatile write operation (store operation), the bit lines BL and XBL are precharged, the word lines WL are deselected (L level), and the plate lines PL1 and PL2 are changed from L level (VSS) to H level (VDD) temporarily. Here, the plate lines PL1 and PL2 are driven to high level at respective different timings. This driving method prevents the input/output nodes (storage nodes) S1 and S2 from undergoing noise ascribable to capacitive coupling through the ferroelectric capacitors FC1–FC4 so that the data stored in the memory cells MC disappears. The data written to the memory cells MC by the nonvolatile write operation is retained even if the supply of the power supply voltage VDD is stopped.

In a recall operation, the plate lines PL1 change from L level (VSS) to H level (VDD) temporarily while the plates PL2 are at L level. The plate lines PL1 are driven to cause capacitive division of the ferroelectric capacitors FC1 and FC3 (and FC2 and FC4), so that voltage differences occur on the input/output nodes S1 (and S2) of the latches LT. Subsequently, the power supplies (VDDV, VSSV) are given to the latches LT, and the latches LT latch the original data. The recall operation is performed automatically when the power supply control circuit 22 detects that the power supply voltage VDD rises to a predetermined value.

Figure 24:
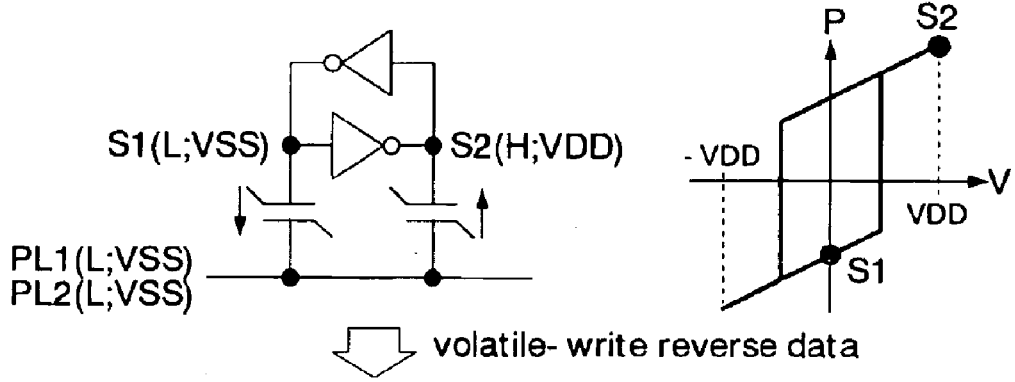
FIG. 24 is an explanatory diagram showing volatile write operations and a nonvolatile write operation of the ferroelectric memory according to the sixth embodiment.
Figure 24:
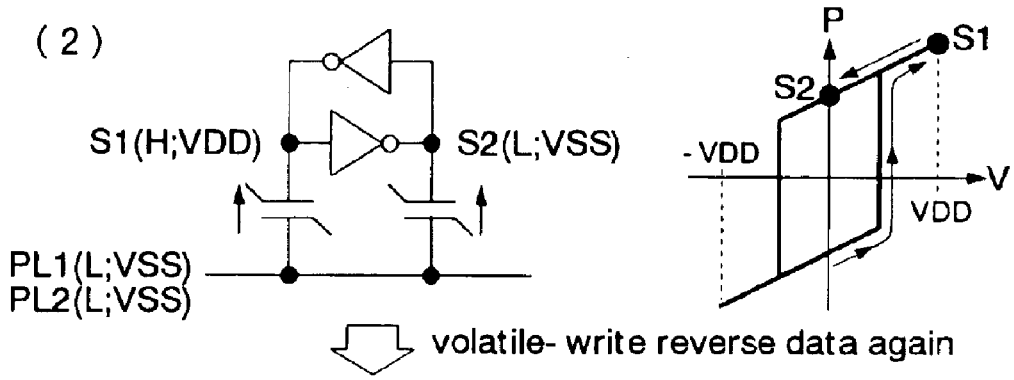
Figure 24:
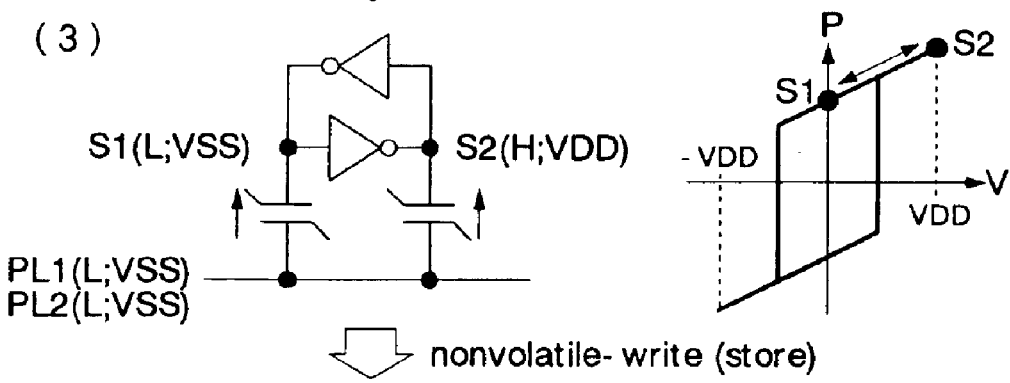
Figure 24:
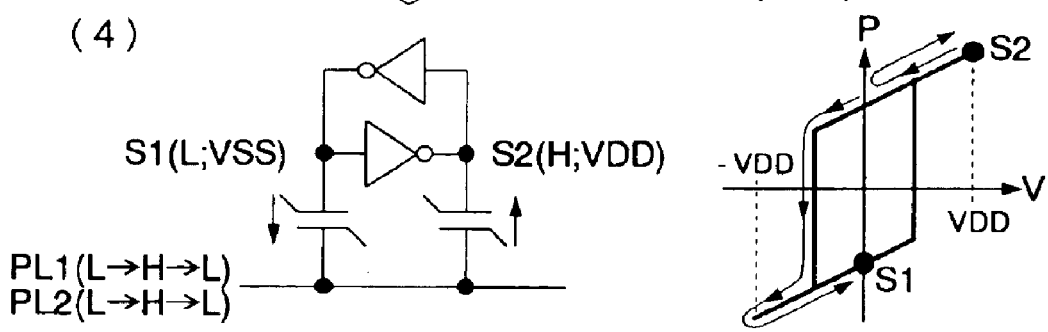

FIG. 24 shows volatile write operations and a nonvolatile write operation of the ferroelectric memory according to the sixth embodiment. The operations shown in the diagram are the same as in the first embodiment (FIG. 11) except that the memory cells MC consist of 6TC4, and that the two plate lines PL1 and PL2 are connected to the memory cells MC. That is, in a volatile write operation, a voltage exceeding the coercive voltage (0.8 V) is applied between the electrodes of the ferroelectric capacitors FC1 and FC3, or FC2 and FC4, that are connected to either one of the input/output nodes S1 and S2 of the latch LT. The ferroelectric capacitors on one side cause reverse polarization only in the first operation of reverse data after a recall operation. In subsequent volatile write operations, the ferroelectric capacitors FC1–FC4 will not cause any reverse polarization. Consequently, volatile write operations will not cause degradation in the characteristics of the ferroelectric capacitors nor impose restriction on the number of volatile write operations.

Figure 25:
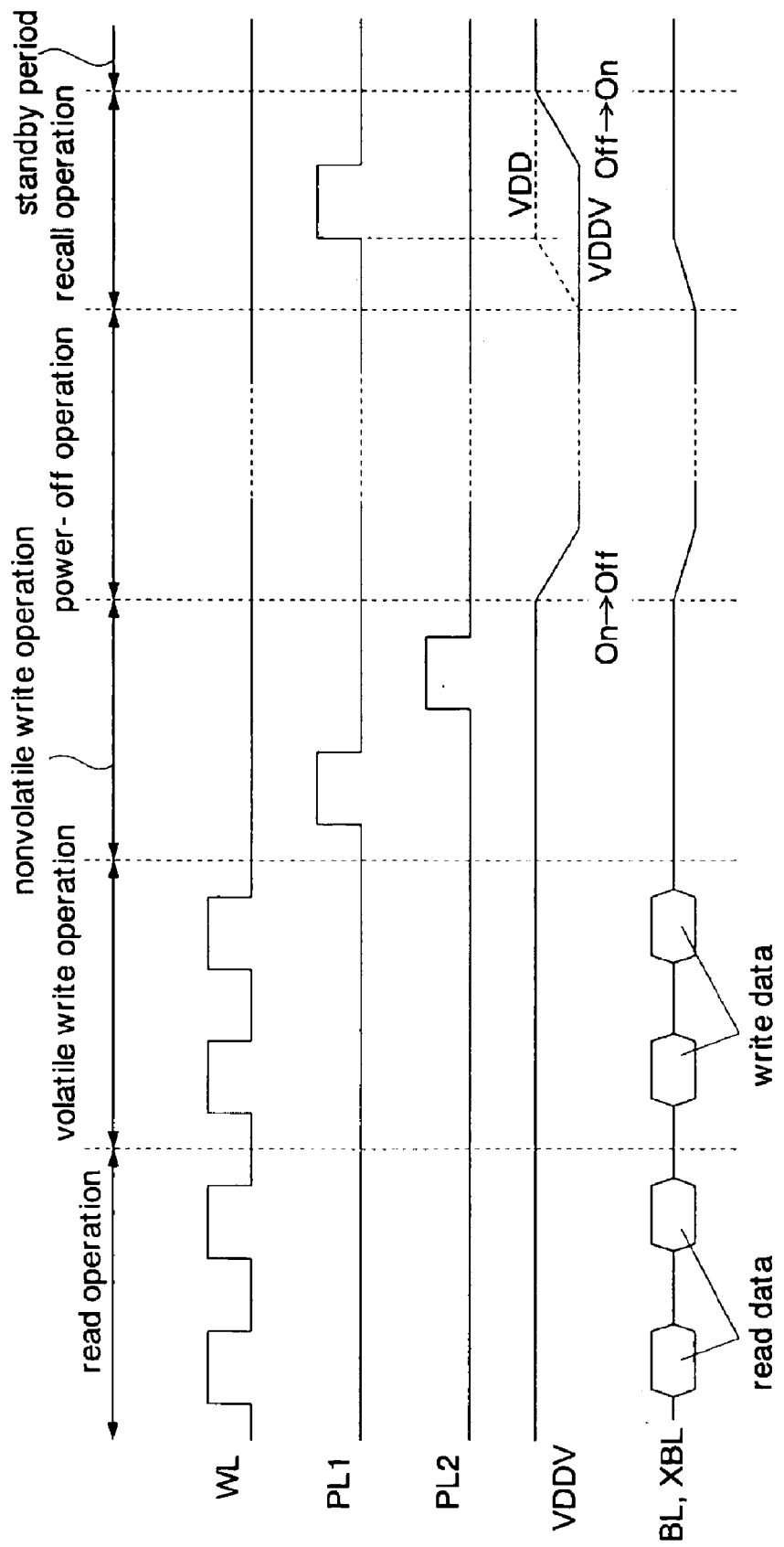
FIG. 25 is a waveform chart showing examples of operation of the ferroelectric memory according to the sixth embodiment.

FIG. 25 shows examples of operation of the ferroelectric memory according to the sixth embodiment. The operations may be performed in any order except that a recall operation must always be performed after power-on. Differences from the first embodiment (FIG. 12) consist in that the plate lines PL1 and PL2 are successively driven to H level in a volatile write operation, and that the plate lines PL1 alone are driven to H level and the plate lines PL2 are maintained at L level in a recall operation. The rest of the operations are the same as in the first embodiment.

As above, the same effects as those of the foregoing first embodiment can also be obtained from this embodiment to which 6TC4 memory cells are applied.

Figure 26:
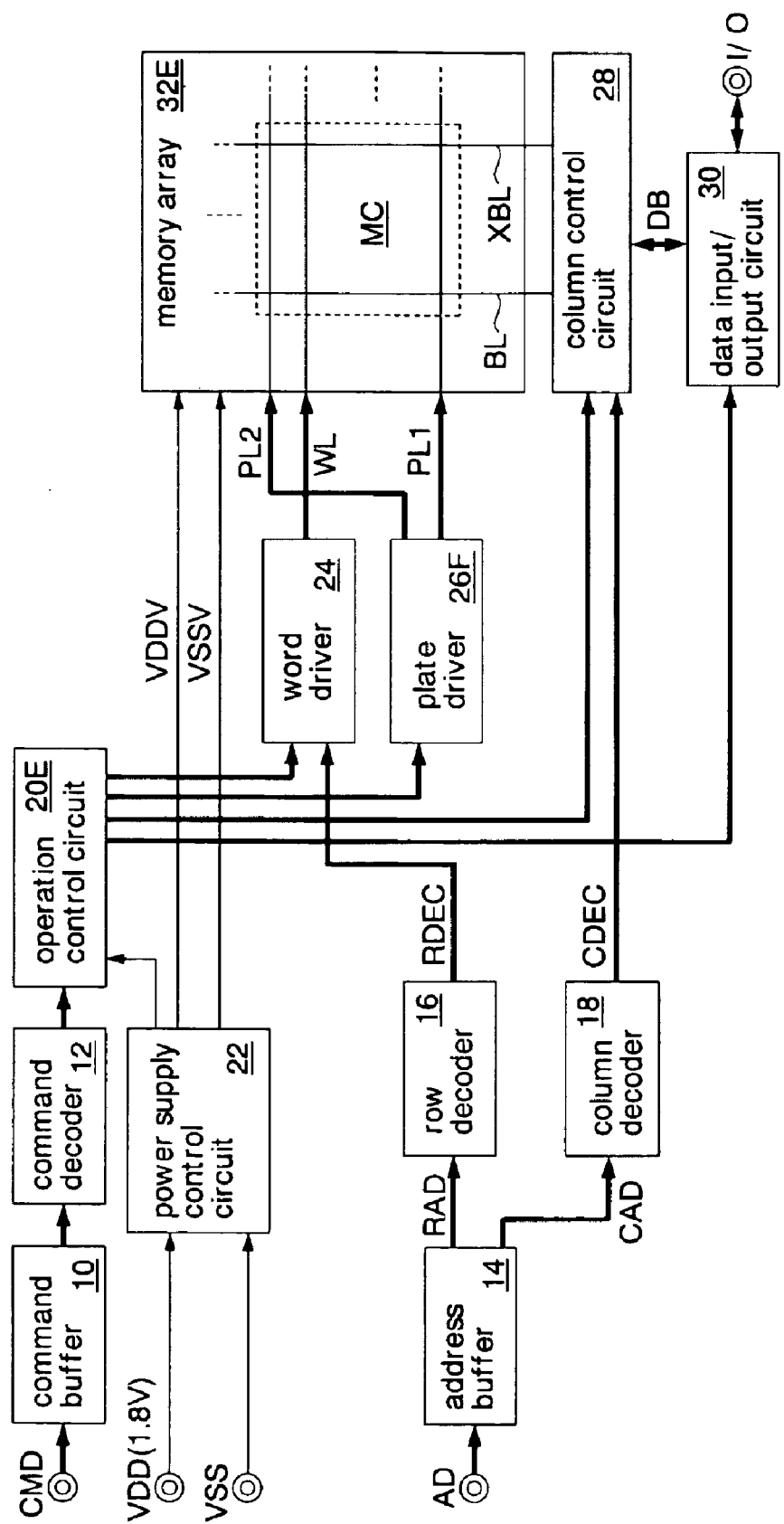
FIG. 26 is a block diagram showing a seventh embodiment of the ferroelectric memory according to the present invention.

FIG. 26 shows a seventh embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. In this embodiment, a plate driver 26F is formed instead of the plate driver 26E of the sixth embodiment. The rest of the configuration is almost the same as in the sixth embodiment.

FIG. 27 shows the operation modes of the ferroelectric memory according to the seventh embodiment. The voltage values of H level and L level are the same as in the first embodiment. The types of the operation modes and the states of the power supply VDD, the bit lines BL and XBL, and the word lines WL in the respective operation modes are the same as in the first and second embodiments (FIGS. 10 and 14). The states of the plate lines PL1 are the same as those of the plate lines PL in the second embodiment. The states of the plate lines PL2 are the same as those of the plate lines PL1 except that they are maintained at L level during a recall operation. Even in this embodiment, there is no restriction on the number of reads and the number of volatile writes as in the sixth embodiment.

Figure 28:
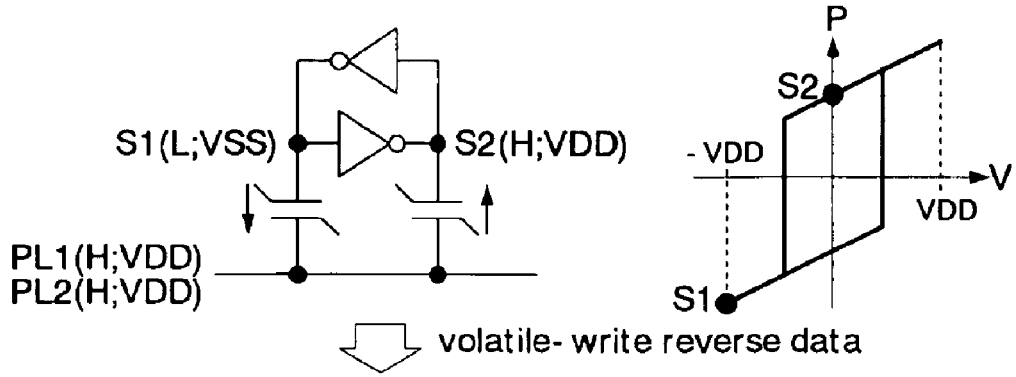
FIG. 28 is an explanatory diagram showing volatile write operations and a nonvolatile write operation of the ferroelectric memory according to the seventh embodiment.
Figure 28:
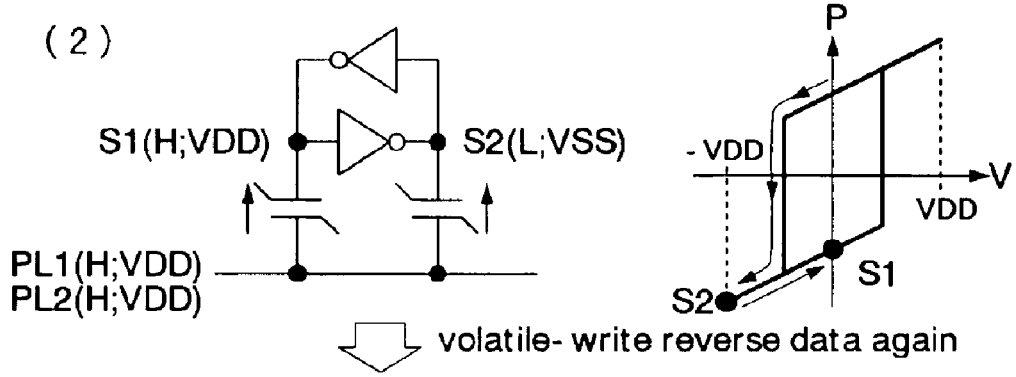
Figure 28:
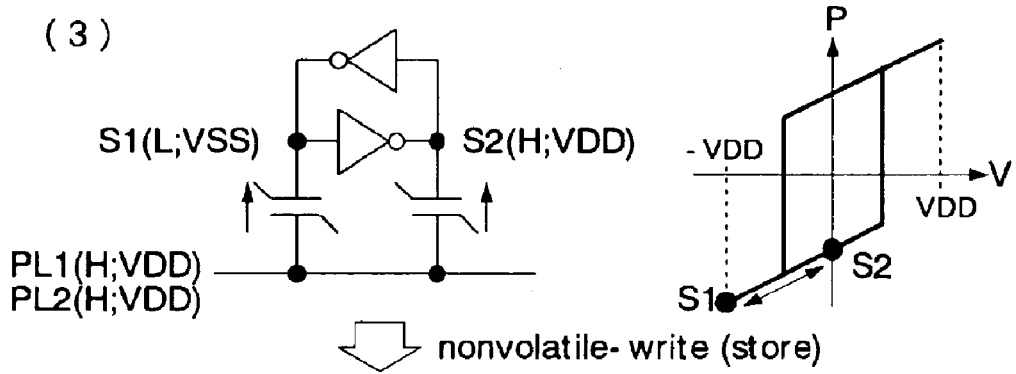
Figure 28:
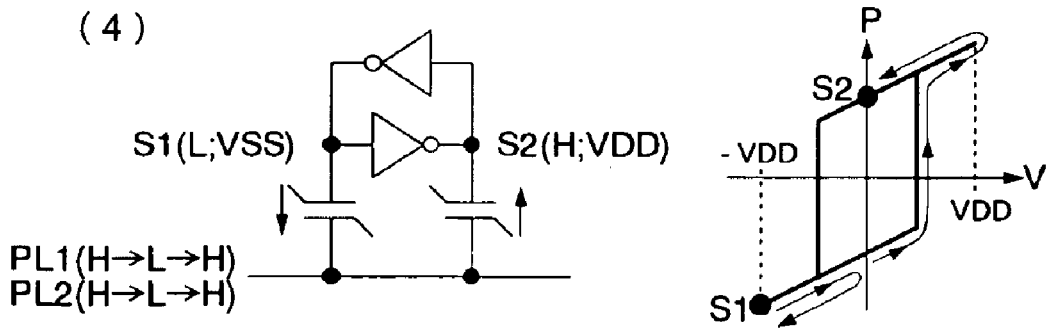

FIG. 28 shows volatile write operations and a nonvolatile write operation of the ferroelectric memory according to the seventh embodiment. The operations shown in the diagram are the same as in the second embodiment (FIG. 15) except that the memory cells MC are of 6TC4, and that the two plate lines PL1 and PL2 are connected to the memory cells MC. That is, in a volatile write operation, a voltage exceeding the coercive voltage (0.8 V) is applied between the electrodes of the ferroelectric capacitors FC1 and FC3, or FC2 and FC4, that are connected to either one of the input/output nodes S1 and S2 of the latch LT. The ferroelectric capacitors on one side cause reverse polarization only in the first operation of reverse data after a recall operation. In subsequent volatile write operations, the ferroelectric capacitors FC1–FC4 will not cause any polarization change. Consequently, volatile write operations will not cause degradation in the characteristics of the ferroelectric capacitors nor impose restriction on the number of volatile write operations.

Figure 29:
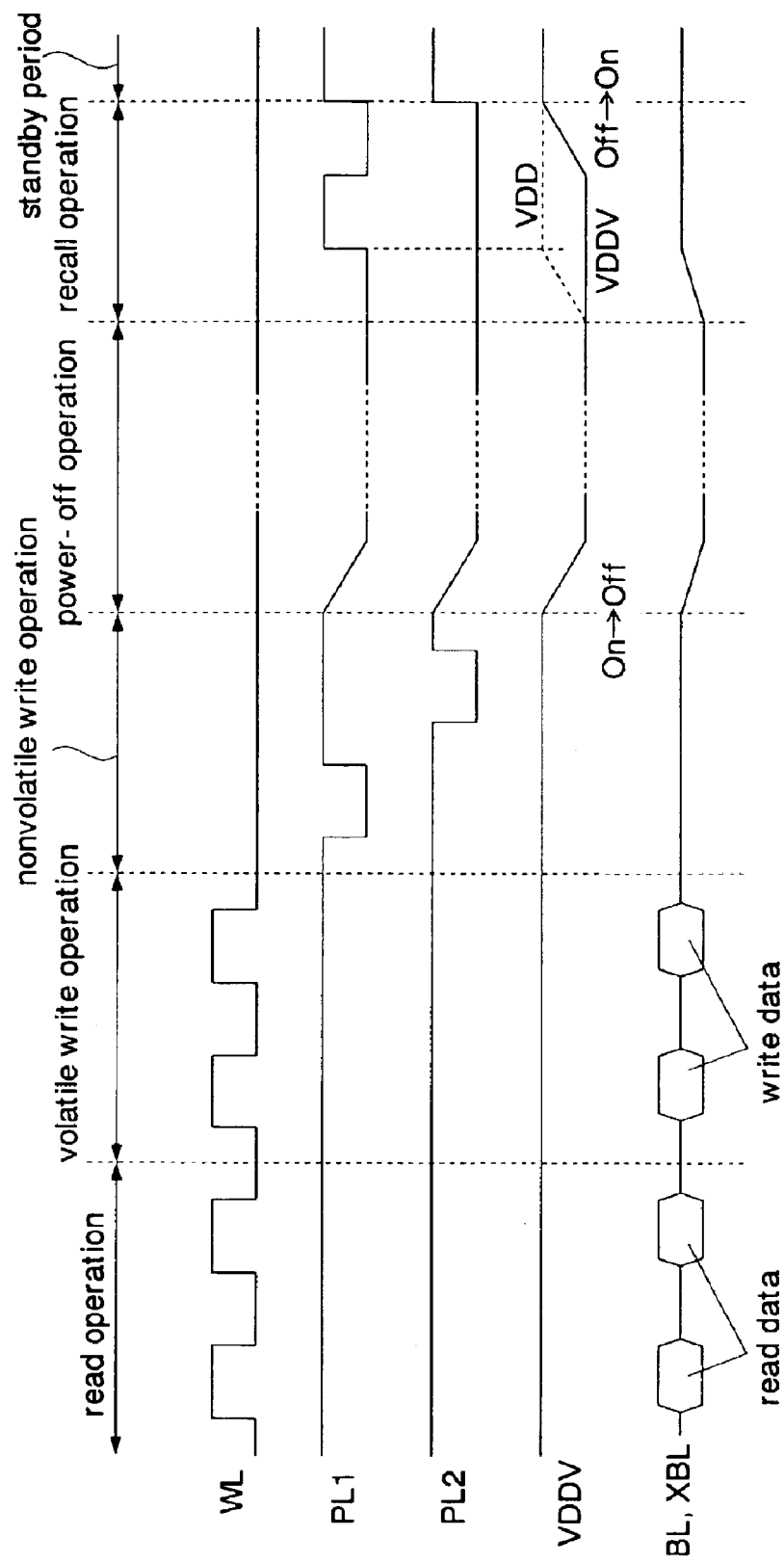
FIG. 29 is a waveform chart showing examples of operation of the ferroelectric memory according to the seventh embodiment.

FIG. 29 shows examples of operation of the ferroelectric memory according to the seventh embodiment. The operations may be performed in any order except that a recall operation must always be performed after power-on. Differences from the second embodiment (FIG. 16) consist in that the plate lines PL1 and PL2 are successively driven to L level in a volatile write operation, and that the plate lines PL1 alone are driven from L level to H level temporarily and the plate lines PL2 are maintained at L level in a recall operation. The plate lines PL1 and PL2 are changed into a standby state, or H level, after a recall operation. The rest of the operations are the same as in the second embodiment.

As above, this embodiment can provide the same effects as those of the first and second embodiments described above.

Figure 30:
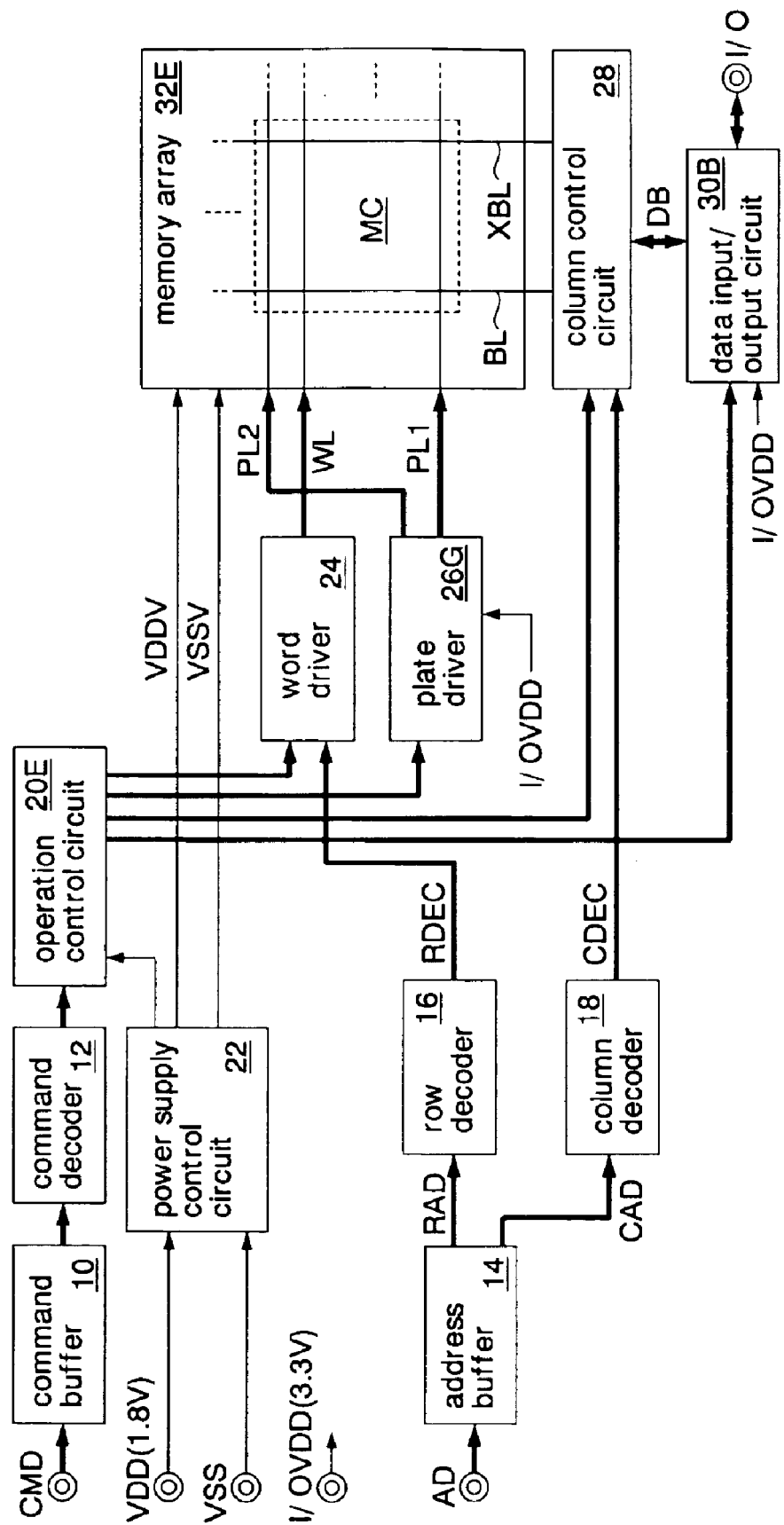
FIG. 30 is a block diagram showing an eighth embodiment of the ferroelectric memory according to the present invention.

FIG. 30 shows an eighth embodiment of the ferroelectric memory of the present invention. The same elements as those described in the first, third, and sixth embodiments will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, a plate driver 26G and the data input/output circuit 30B of the third embodiment are formed instead of the plate driver 26E and the data input/output circuit 30 of the sixth embodiment. In addition, a power supply terminal I/OVDD for receiving a power supply voltage I/OVDD (for example, 3.3 V) for I/O is formed. The power supply voltage I/OVDD is supplied to the data input/output circuit 30B and the plate driver 26G. The plate driver 26G uses the power supply voltage I/OVDD as the H-level voltage of the plate lines PL1 and PL2. The rest of the configuration is almost the same as in the sixth embodiment.

The operation modes of this embodiment are the same as those of the sixth embodiment except that the H level of the plate lines PL in a nonvolatile write operation (store operation) and a recall operation is the power supply voltage I/OVDD. That is, in a volatile write operation, a voltage exceeding the coercive voltage (0.8 V) is applied between the electrodes of the ferroelectric capacitors FC1 and FC3, or FC2 and FC4, that are connected to either one of the input/output nodes (storage nodes) S1 and S2 of the latch LT. The ferroelectric capacitors on one side cause reverse polarization in the first operation of reverse data after a recall operation. In subsequent volatile write operations, the ferroelectric capacitors FC1–FC4 will not cause any reverse polarization. This eliminates the restriction on the number of volatile write operations. In addition, since the driving voltage (3.3 V) of the plate lines PL in a nonvolatile write operation is higher than the power supply voltage VDDV (1.8 V=VDD) to be supplied to the latches LT, the imprint effect is reduced.

As above, this embodiment can provide the same effects as those of the first and third embodiments described above.

Figure 31:
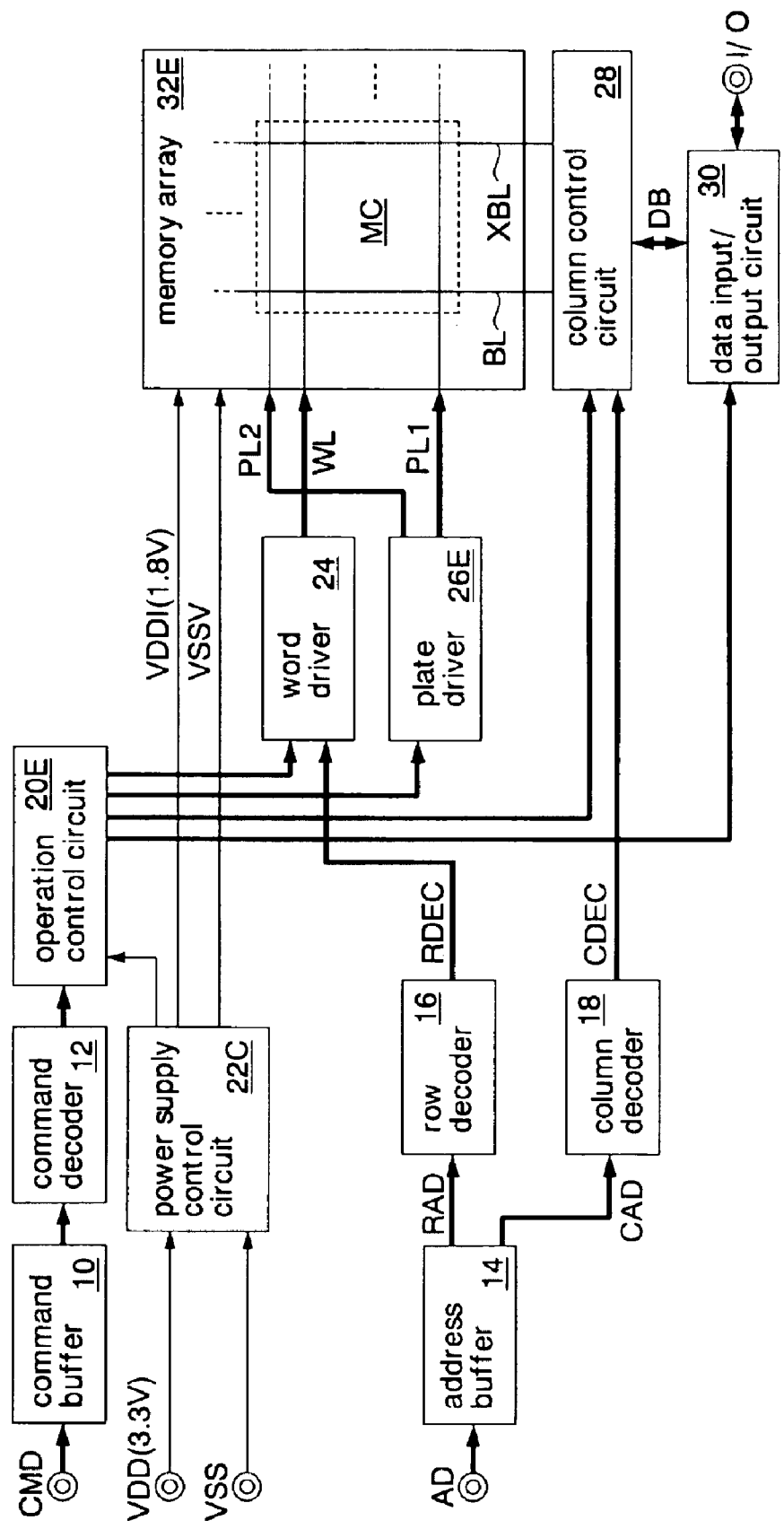
FIG. 31 is a block diagram showing a ninth embodiment of the ferroelectric memory according to the present invention.

FIG. 31 shows a ninth embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, the power supply control circuit 22C of the fourth embodiment is formed instead of the power supply control circuit 22 of the sixth embodiment. The power supply voltage VDD supplied to the power supply terminal VDD is 3.3 V. The rest of the configuration is almost the same as in the sixth embodiment.

Among the operation modes of this embodiment, a nonvolatile write operation (store operation) and a recall operation set the H level of the plate lines PL at 3.3 V. The power supply voltage of the other circuits is 1.8 V. Thus, as in the eighth embodiment, the restriction on the number of volatile write operations is removed by the application of a voltage higher than the coercive voltage (0.8 V) to between the electrodes of the ferroelectric capacitors FC1 and FC3, or FC2 and FC4, connected to either one of the input/output nodes (storage nodes) S1 and S2 of the latches LT during volatile write operations. In addition, since the driving voltage (3.3 V) of the plate lines PL in a nonvolatile write operation is higher than the power supply voltage VDDV (1.8 V=VDD) to be supplied to the latches LT, the imprint effect is reduced.

As above, this embodiment can provide the same effects as those of the first and third embodiments described above.

Figure 32:
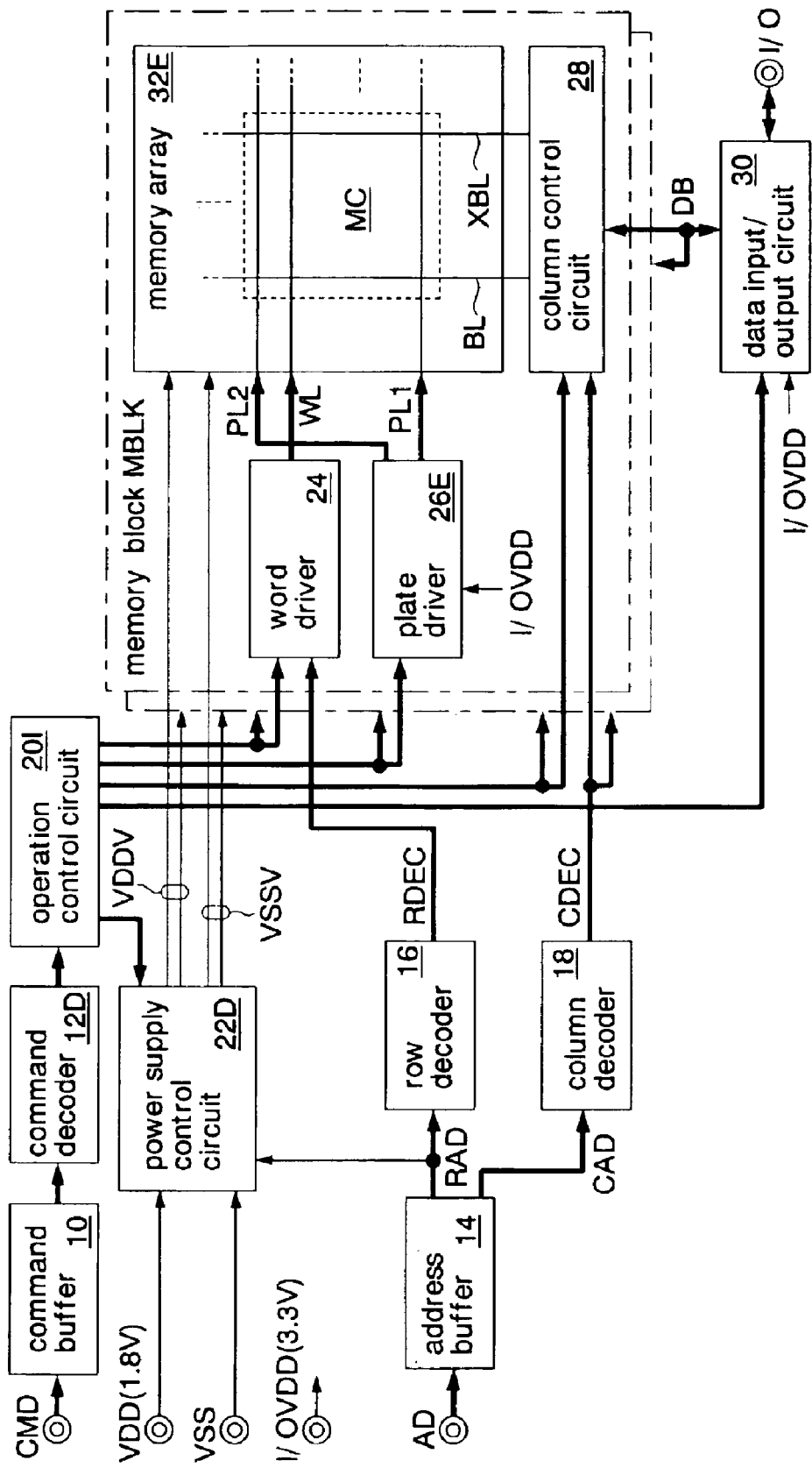
FIG. 32 is a block diagram showing a tenth embodiment of the ferroelectric memory according to the present invention.

FIG. 32 shows a tenth embodiment of the ferroelectric memory of the present invention. The same elements as those described in the first embodiment will be designated by identical reference numbers or symbols. Detailed description thereof will be omitted. The ferroelectric memory is formed as a nonvolatile SRAM on a silicon substrate by using CMOS processes. The nonvolatile SRAM is incorporated, for example, as a memory core in a system LSI to be mounted on a cellular phone. In this embodiment, an operation control circuit 201 and the command decoder 12D and power supply control circuit 22D of the fifth embodiment are formed instead of the operation control circuit 20E, the command decoder 12, and the power supply control circuit 22 of the sixth embodiment. The operation control circuit 201 has the same functions as those of the operation control circuit 20D of the fifth embodiment except in the control signal it outputs to the plate driver 26E.

As in the fifth embodiment, the nonvolatile SRAM has a plurality of memory blocks MBLK (in this example, two). The memory blocks MBLK have a word driver 24, a plate driver 26E, a memory array 32E, and a column control circuit 28 each, and operate independent of each other under the control of the operation control circuit 201. In addition, a power supply terminal I/OVDD for receiving a power supply voltage I/OVDD (for example, 3.3 V) for I/O is formed. The rest of the configuration is almost the same as in the eighth embodiment.

FIG. 33 shows the operation modes of the ferroelectric memory according to the tenth embodiment. Detailed description will be omitted of the same operations as in the first, fifth, and sixth embodiments (FIGS. 10, 20, and 23). As in the fifth embodiment, the operation modes are shown for each memory block MBLK. That is, the individual operations shown in the operation modes are performed with respect to each of the memory blocks MBLK. For example, a read operation and a volatile write operation are performed on a memory block MBLK selected by the row address signal RAD, in units of a single bit for each data terminal I/O. A nonvolatile write operation (block store) and a recall operation (block recall) are performed on all the bits of the memory block MBLK selected by the row address signal RAD. In each of the operations, the power supply lines and signal lines are in the same states as in the sixth embodiment (FIG. 23).

The nonvolatile SRAM receives a power-on command, a power-off command, and a recall command, and performs a power-on operation, a power-off operation, and a recall operation by each memory block MBLK. The power-off operation in response to the power-off command stops the supply of the power supplies VDDV and VSSV to the memory array 32 in the selected memory block MBLK alone. Since the supply of the power supplies VDDV and VSSV to the memory cells MC is stopped, the memory cells MC has zero leakage current.

As above, this embodiment can provide the same effects as those of the first and fifth embodiments described above.

Incidentally, the foregoing first to fourth and sixth to ninth embodiments have dealt with the cases where the power supply control circuit 22, 22C is operated to perform a recall operation at the time of power-on. However, the present invention is not limited to such embodiments. For example, the power supply control circuit 22, 22C may be operated to perform a store operation (nonvolatile write operation) when the power supply voltage VDD falls to a predetermined value (for example, at the time of power-off). In this case, the power supply control circuit 22, 22C outputs a recall command and a store command for performing a store operation to the operation control circuit 20 according to the power supply voltage VDD.

The foregoing first, third to sixth, and eighth to tenth embodiments have dealt with the cases where the voltage of the plate lines PL (or PL1, PL2) is set at the ground voltage VSS during a volatile write operation. However, the present invention is not limited to such embodiments. For example, during a volatile write operation, the voltage of the plate lines PL (or PL1, PL2) may be set at a voltage lower than the ground voltage VSS to be supplied to the latches LT.

The foregoing second and seventh embodiments have dealt with the cases where the voltage of the plate lines PL (or PL1, PL2) is set at the power supply voltage VDD during a volatile write operation. However, the present invention is not limited to such embodiments. For example, during a volatile write operation, the voltage of the plate lines PL (or PL1, PL2) may be set at a voltage higher than the power supply voltage VDDV (=VDD) to be supplied to the latches LT.

The foregoing fifth and tenth embodiments have dealt with the cases where the nonvolatile SRAM contains a plurality of memory blocks MBLK which are nonvolatile units. However, the present invention is not limited to such embodiments. For example, a plurality of SRAM macros to be implemented in a logic LSI may be made of nonvolatile SRAMs according to the present invention. In this case, while the logic LSI is in operation, the power supply of unused SRAM macros can be turned off to reduce the leakage currents of the memory cells and reduce the standby current of the logic LSI.

The foregoing embodiments have dealt with the cases where data is input/output in units of a single bit for each data terminal I/O in a read operation and a write operation. However, the present invention is not limited to such embodiments. For example, in a read operation and a write operation, data may be input/output in units of a single word (for example, four bits of serial data) for each data terminal I/O.

The foregoing embodiments have dealt with the cases where the present invention is applied to a nonvolatile SRAM to be mounted on a cellular phone. However, the present invention is not limited to such embodiments. For example, the present invention may be applied to a nonvolatile SRAM core to be implemented in radio frequency identification (RFID) tag LSIs or smart card LSIs.

The foregoing embodiments have dealt with the cases where the present invention is applied to a memory core to be implemented in a system LSI or the like. However, the present invention is not limited to such embodiments. For example, the present invention may be applied to a ferroelectric memory device (single-chip memory).

The invention is not limited to the above embodiments and various modifications may be made without departing from the spirit and scope of the invention. Any improvement may be made in part or all of the components.

What is claimed is:

1. A ferroelectric memory comprising:
    a plurality of memory cells each including a latch having a pair of storage nodes through which complementary data is input/output, and ferroelectric capacitors connected to said storage nodes at one ends, respectively;
    a plate line connected to the other ends of said ferroelectric capacitors;
    an operation control circuit which performs a volatile write operation for writing write data into said latch and a nonvolatile write operation for writing said write data retained in said latch into said ferroelectric capacitors; and
    a plate driver which sets said plate line to a predetermined voltage so that a voltage exceeding a coercive voltage is applied between electrodes of one of said ferroelectric capacitors connected to either one of said storage nodes of said latch during said volatile write operation.

2. The ferroelectric memory according to claim 1, wherein:

said latch receives a ground voltage and a fixed power supply voltage, and outputs said power supply voltage or said ground voltage to said storage nodes according to a logic of the retained write data; and said plate driver maintains the voltage of said plate line at a voltage either one of lower than or equal to said ground voltage and higher than or equal to said power supply voltage during said volatile write operation.

3. The ferroelectric memory according to claim 2, wherein said plate driver maintains the voltage of said plate line at said ground voltage during said volatile write operation.

4. The ferroelectric memory according to claim 2, wherein said plate driver maintains the voltage of said plate line at said power supply voltage during said volatile write operation.

5. The ferroelectric memory according to claim 1, wherein said plate driver maintains the voltage of said plate line at a first voltage during said volatile write operation, and changes the voltage of said plate line from said first voltage to a second voltage during said nonvolatile write operation.

6. The ferroelectric memory according to claim 5, wherein:

said latch receives a ground voltage and a fixed power supply voltage at its supply terminals, and outputs said power supply voltage or said ground voltage to said input/output nodes according to a logic of the retained write data;

said first voltage is said ground voltage; and said second voltage is higher than said power supply voltage.

7. The ferroelectric memory according to claim 6, comprising:

a data terminal;

a data input/output circuit which inputs/outputs data from/to said data terminal; and an I/O power terminal which receives an I/O power supply voltage to be supplied to said data input/output circuit, and wherein said second voltage is said I/O power supply voltage.

8. The ferroelectric memory according to claim 6, comprising:

a power supply terminal which receives an external power supply voltage; and a power supply control circuit which steps down said external power supply voltage to said power supply voltage, and wherein said first voltage is said ground voltage, and said second voltage is said external power supply voltage.

9. The ferroelectric memory according to claim 1, further comprising a command control circuit which receives a volatile write command for performing said volatile write operation and a nonvolatile write command for performing said nonvolatile write operation, and wherein said operation control circuit performs said volatile write operation and said nonvolatile write operation in response to said volatile write command and said nonvolatile write command, respectively.

10. The ferroelectric memory according to claim 1, further comprising:

a power supply terminal to be supplied with a power supply voltage; and a power supply control circuit which detects that said power supply voltage rises to a predetermined value at the time of power-on, and starts supplying said power supply voltage to the latches a predetermined time after the detection, and wherein said operation control circuit changes the voltage of said plate line from an initial voltage to a predetermined voltage in response to the detection by said power supply control circuit in order to perform a recall operation for recalling data previously written in said ferroelectric capacitors back to the latches, and said predetermined time is the time between the instant when the detection is done and the instant when the voltage of said plate line reaches said predetermined voltage.

11. The ferroelectric memory according to claim 1, further comprising a plurality of data terminals which receives a plurality of bits of write data by each bit or each word, and wherein said volatile write operation is performed in units of a single bit or a single word for each of said data terminals, and said nonvolatile write operation is performed on all said memory cells.

12. The ferroelectric memory according to claim 1, further comprising:

a plurality of data terminals which receives a plurality of bits of write data by each bit or each word; and a plurality of memory blocks each including a predetermined number of said memory cells, and wherein said volatile write operation is performed in units of a single bit or a single word for each of said data terminals, and said nonvolatile write operation is performed on all memory cells with respect to each of said memory blocks.

13. The ferroelectric memory according to claim 12, further comprising:

a command control circuit which receives a power-off command for powering off said memory blocks, respectively; and a power supply control circuit which stops supplying a power supply voltage to a selected memory block in response to said power-off command.

14. The ferroelectric memory according to claim 13, wherein said power supply control circuit selects one of said memory blocks according to an address signal supplied along with said power-off command, and stops supplying said power supply voltage to a selected memory block.

15. The ferroelectric memory according to claim 13, wherein:

said command control circuit receives a recall command for performing a recall operation for recalling data written in said ferroelectric capacitors back to the latches with respect to each of said memory blocks; and said operation control circuit changes the voltage of said plate line from an initial voltage to a predetermined voltage in response to said recall command, and then makes said power supply control circuit start supplying said power supply voltage to the latches of said selected memory block.

16. The ferroelectric memory according to claim 15, wherein said power supply control circuit selects one of said memory blocks according to an address signal supplied along with said recall command, and starts supplying said power supply voltage to a selected memory block.

17. The ferroelectric memory according to claim 1, further comprising complementary bit lines which transfer complementary write data to said memory cells, wherein said memory cells each include:

said latch composed of a pair of CMOS inverters;

a pair of transfer transistors which connects outputs of said CMOS inverters to said complementary bit lines, respectively; and said ferroelectric capacitors connected between the respective outputs of said CMOS inverters and said plate line.

18. The ferroelectric memory according to claim 1, further comprising complementary bit lines which transfer complementary write data to said memory cells, wherein said memory cells each include:

said latch composed of a pair of CMOS inverters;

a pair of transfer transistors which connects outputs of said CMOS inverters to said complementary bit lines, respectively;

said ferroelectric capacitors connected between the respective outputs of said CMOS inverters and said plate line; and ferroelectric capacitors connected between the respective outputs of said CMOS inverters and a plate line different from said plate line.

* * * * *